(12) United States Patent
Shimabukuro et al.

(10) Patent No.: US 6,190,933 B1
(45) Date of Patent: Feb. 20, 2001

(54) ULTRA-HIGH RESOLUTION LIQUID CRYSTAL DISPLAY ON SILICON-ON-SAPPHIRE

(75) Inventors: Randy L. Shimabukuro; Stephen D. Russell; Bruce W. Offord, all of San Diego, CA (US)

(73) Assignee: The United States of America as represented by the Secretary of the Navy, Washington, DC (US)

( * ) Notice: Under 35 U.S.C. 154(b), the term of this patent shall be extended for 0 days.

(21) Appl. No.: 09/047,813

(22) Filed: Mar. 25, 1998

Related U.S. Application Data

(60) Continuation-in-part of application No. 08/105,252, filed on Aug. 4, 1993, now abandoned, which is a division of application No. 08/301,170, filed on Sep. 1, 1994, now abandoned, and a continuation-in-part of application No. 08/094,541, filed on Jun. 30, 1993.

(51) Int. Cl.$^7$ .................................................. H01L 21/00
(52) U.S. Cl. .............................. 438/30; 438/152; 438/158
(58) Field of Search .............................. 438/30, 158, 151, 438/152

(56) References Cited

U.S. PATENT DOCUMENTS

| | | |
|---|---|---|
| 4,024,626 | 5/1977 | Leupp et al. . |
| 4,177,084 | 12/1979 | Lau et al. . |
| 4,694,347 | 9/1987 | Ito . |
| 4,716,403 | 12/1987 | Morozumi . |
| 4,888,632 | 12/1989 | Haller . |
| 5,300,443 | 4/1994 | Shimabukuro et al. . |
| 5,323,042 | * 6/1994 | Matsumoto et al. ................ 257/350 |
| 5,750,000 | * 5/1998 | Yonehara et al. ...................... 438/30 |
| 5,827,755 | * 10/1998 | Yonehara et al. ...................... 438/30 |
| 5,834,328 | * 11/1998 | Jang ...................................... 438/30 |
| 5,937,271 | * 8/1999 | Min ....................................... 438/30 |
| 5,953,584 | * 9/1999 | Lim et al. ............................. 438/30 |

OTHER PUBLICATIONS

Noguchi et al, "Grain Growth and Conductive Characteristics of Super Thin Polysilicon Films by Oxidation", *Japanese Journal of Applied Physics, Part 2 (Letters)*, Jun. 1985, pp. L434–L436, vol. 24, No. 6, Japan.

* cited by examiner

Primary Examiner—Richard T. Elms
Assistant Examiner—Michael S. Lebentritt
(74) Attorney, Agent, or Firm—Harvey Fendelman; Peter A. Lipovsky; Michael A. Kagan

(57) ABSTRACT

A liquid crystal array and associated drive circuitry are monolithically formed on a silicon-on-sapphire structure, and are fabricated by a method comprising the steps of: a) forming an epitaxial silicon layer on a sapphire substrate to create a silicon-on-sapphire structure; b) ion implanting the epitaxial silicon layer; c) annealing the silicon-on sapphire structure; d) oxidizing the epitaxial silicon layer to form a silicon dioxide layer from a portion of the epitaxial silicon layer so that a thinned epitaxial silicon layer remains; e) removing the silicon dioxide layer to expose the thinned epitaxial silicon layer; f) fabricating an array of pixels from the thinned epitaxial silicon layer wherein each of the pixels includes a liquid crystal capacitor; and g) fabricating integrated circuitry from the thinned epitaxial silicon layer which is operably coupled to modulate the pixels. The thinned epitaxial silicon supports the fabrication of device quality circuitry on the silicon-on-sapphire structure which is used to control the operation of the pixels.

21 Claims, 21 Drawing Sheets

ULTRA-HIGH RESOLUTION LIQUID CRYSTAL DISPLAY ON SILICON-ON-SAPPHIRE

CROSS REFERENCE TO RELATED APPLICATIONS

This application is a continuation-in-part of U.S. patent application Ser. No. 08/105,252 (Navy Case No. 73,925) filed Aug. 4, 1993, entitled "Ultra-High Resolution Liquid Crystal Display on Silicon-On-Sapphire," now abandoned; a divisional of U.S. patent application Ser. No. 08/301,170 (Navy Case No. 74,146) filed Sep. 1, 1994, entitled "Method for Fabricating Electrically Addressable Silicon-On-Sapphire Light Valve," now abandoned;" and a continuation-in-part of U.S. Ser. No. 08/094,541, filed Jun. 30, 1993 (Navy Case No. 73,899), entitled "Method for Fabricating Complementary Enhancement and Depletion Mode Field Effect Transistors on a Single Substrate."

BACKGROUND OF THE INVENTION

Liquid crystal displays are used in a wide variety of commercial applications including portable (laptop) computers, wristwatches, camcorders and large screen televisions. Liquid crystal light valves, used as spatial light modulators, may be used in projection systems as well as optical computing applications. Limitations inherent in the existing technology come from the necessity of fabricating the displays on transparent glass or quartz substrates which are not amenable to high quality electronic materials. Fabrication of displays on bulk silicon, although of high crystal quality, unnecessarily constrains the display to reflective mode schemes due to the opaque substrate and is not applicable to transmissive applications. The ability to integrate drive circuitry using thin-film transistors (TFTs) with liquid crystal displays has improved reliability and has allowed the use of this technology in lightweight, portable applications. However, the integration of display driving circuitry heretofore has been substantially limited to thin film transistor technology using amorphous (a-Si) or polycrystalline (p-Si) silicon deposited on the glass or quartz substrate. The intrinsic properties such as lattice and thermal mismatch between the silicon layer and the substrate, and the low temperature deposition techniques used in the a-Si and p-Si technologies result in a silicon layer with poor charge carrier mobility and crystallographic defects. These limitations are directly related to inferior electronic device performance and limitations when compared to bulk silicon.

Of particular importance for integrated display systems is the desire for higher density circuitry for ultra-high resolution display and light valve applications and for the monolithic integration of display driver circuitry and related signal processing circuitry on-chip. The characteristic lower (electrical and crystallographic) qualities of a-Si and p-Si materials result in poor fabrication yields when compared to conventional Very Large Scale Integration (VLSI) processing. Overcoming this problem, inherent in the poorer quality amorphous or polycrystalline material, requires the use of redundant circuit elements in each pixel to ensure fully functional displays in a-Si and p-Si. This redundancy requires an concomitant increase in the picture element (pixel) size thereby inhibiting the ability to scale displays and light valves to ultra-high resolution. The additional circuit elements also reduce the aperture ratio, i.e. the fraction of pixel area allowing transmitted light, thereby reducing the brightness of the display or light valve.

Furthermore, the low carrier mobility, low speed, low yield a-Si and p-Si materials are incompatible with VLSI design and fabrication techniques which would otherwise readily allow integration of video drivers, digital logic and other computational circuitry on-chip thereby offering designers greater functionality, higher reliability, and improved performance.

The prior art has attempted to overcome the material problems associated with a-Si and p-Si using a novel crystalline silicon process to implement drive circuitry on the display. U.S. Pat. No. 5,206,749 entitled "Liquid Crystal Display Having Essentially Single Crystal Transistors Pixels and Driving Circuits" by P. M. Zavracky et al. teaches an approach where the electronics are fabricated on an opaque recrystallized silicon layer. This silicon-on-insulator material is prepared by a so-called isolated silicon epitaxy (ISE) process. The display circuitry is then lifted off and transferred to a transparent substrate.

B. Bahadur, editor, Liquid Crystals: Applications and Uses, Vol. 1, World Scientific, New Jersey, 1990, pp. 448–451 reviews the state of the art in active matrix displays for projection display applications. Active-matrix displays use one or more nonlinear circuit elements, e.g. TFTs or diodes, to switch the liquid crystal capacitor in each pixel. Among the materials discussed for these applications included silicon-on-sapphire (SOS). The authors state recognized limitations of SOS on page 450 "although SOS devices have excellent performance in terms of drive current and speed, they have leakage currents which are too high for use in an active matrix display." These limitations are further evidenced by table 16.3 and FIG. 16.9 on page 451 showing excessive leakage currents for SOS TFT devices. The excessive leakage results in a drop in voltage across the liquid crystal capacitor which, in the case of commonly used nematic liquid crystals, results in a orientational change and change in gray level. These known and recognized limitations of SOS are evidence that it is contrary to what is allegedly known in the art and therefore it is not obvious to one skilled in the art that SOS could be used for an active matrix display using nematic liquid crystals without introducing inferior changes of light levels in the display.

Thus, in accordance with this inventive concept a continuing need has been recognized in the state of the art for an electrically addressable ultra-high resolution nematic liquid crystal display or light valve system which monolithically integrates an active matrix display with its associated drive and image processing circuitry and an apparatus and method of fabrication of an electrically addressable ultra-high resolution crystal display which may include nematic or ferroelectric liquid crystal capacitors formed on an ultra-thin silicon-on-sapphire structure (UTSOS) which allows VLSI fabrication techniques, has a transparent substrate, and uses high performance, low leakage circuit elements (MOSFETs) that allow monolithic fabrication of a complete display or light valve system.

SUMMARY OF THE INVENTION

The present invention provides a method for fabricating a monolithically integrated liquid crystal array display and control circuitry on a silicon-on-sapphire structure comprises the steps of: a) forming an epitaxial silicon layer on a sapphire substrate to create a silicon-on-sapphire structure; b) ion implanting the epitaxial silicon layer; c) annealing the silicon-on sapphire structure; d) oxidizing the epitaxial silicon layer to form a silicon dioxide layer from a portion of the epitaxial silicon layer so that a thinned epitaxial silicon layer remains; e) removing the silicon dioxide layer to expose the thinned epitaxial silicon layer; f) fabricating an array of pixels from the thinned epitaxial silicon layer wherein each of the pixels includes a liquid crystal capacitor; and g) fabricating integrated circuitry from the thinned epitaxial silicon layer which is operably coupled to modulate the pixels. The thinned epitaxial silicon supports the fabrication of device quality circuitry on the silicon-on-sapphire structure which is used to control the operation of the pixels. The types of liquid crystal capacitors that may be fabricated in conjunction with the invention may be ferroelectric liquid crystal capacitors and nematic liquid crystal capacitors.

The present invention also provides a liquid crystal display which includes a silicon-on-sapphire structure. The silicon-on-sapphire structure includes an epitaxial silicon layer formed by oxidizing the epitaxial silicon layer to form a silicon dioxide layer from a portion of the epitaxial silicon layer. The silicon dioxide layer is removed from the epitaxial silicon layer not consumed by the oxide so that a thinned epitaxial silicon layer remains. The invention further includes an array of liquid crystal capacitors formed on the thinned silicon-on-sapphire structure and integrated circuitry operably coupled to modulate the liquid crystal capacitors. The integrated circuitry is formed from the thinned epitaxial silicon layer. The thinned epitaxial silicon layer is an important feature which makes possible fabrication of device quality circuitry on the silicon-on-sapphire structure.

Other advantages of the invention will become more apparent upon review of the following specification, including the claims, and the accompanying figures.

DISCLOSURE OF THE PREFERRED EMBODIMENT

Figure 1:
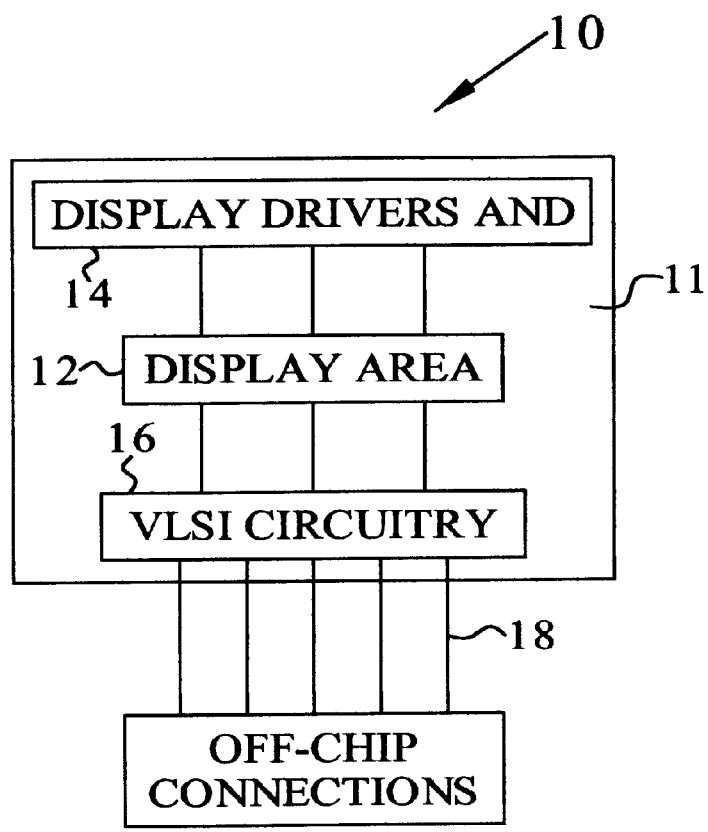
FIG. 1 schematically shows a nematic liquid crystal display monolithically integrated with associated circuitry on an improved-UTSOS wafer.

Referring to FIG. 1, the disclosed invention calls for display system 10 of a nematic liquid crystal display monolithically integrated with associated drive circuitry and image processing electronics on an improved ultrathin silicon-on-sapphire (UTSOS) wafer 11, and the method for fabricating the integrated structure. The description below will point out the salient features of this invention and its advantages over the teachings of the prior art. Starting from improvements to the basic building block, the picture element (pixel), and up through the improved fully integrated structure, the advantages of this invention will be apparent alone and in combination. Therefore, the synergistic combination provided by this invention is an unobvious and a significant advance in the art. Salient advantages of the herein described invention over the prior art will also become apparent from review of the specification and figures. One such advantage of the herein disclosed and claimed inventive process that allows the fabrication of devices and circuits in a thinner silicon layer (ultrathin silicon-on-sapphire or UTSOS). Electronic devices and circuits can be operated in a fully depleted mode and do not require body ties for improved performance and design. The thinner crystalline silicon layer of the disclosed and claimed invention herein will also be important for projection applications since the thinner silicon absorbs less light and the devices will have lower light-induced leakage currents. Furthermore, the ultra-thin silicon layers of the herein disclosed and claimed invention assure reduced carrier lifetime and reduced light-induced leakage compared to similarly dimensioned bulk silicon or ISE silicon layers. Additionally, the thermal conductivity of sapphire in accordance with the disclosed and claimed invention herein is much higher than glass, quartz or epoxy envisioned by the prior art and therefore the herein disclosed and claimed invention devices will not exhibit a decrease in current in the saturation region, a phenomenon known as self heating. The present invention provides a liquid crystal array display which avoids the inherent leakage problems in SOS devices by using ferroelectric liquid crystals (FLCs). The circuit architecture for driving these bistable FLC materials avoids the requirement for having stringent, low leakage in SOS circuits. Another embodiment of the present invention improves the device performance and pixel architecture of the SOS circuit elements such that the requirement of using bistable FLCs is removed and conventional nematic liquid crystals can be suitably integrated for high-density displays.

FIG. 1 schematically shows a display system 10 having the top view nematic liquid crystal display 12 monolithically integrated with associated circuitry 14 and 16 on an improved-UTSOS wafer. A display area 12 in display or light valve system 10 has an array of picture elements (pixels) which provide the image for viewing or projection. In the preferred embodiment, a 1000 pixel×1000 pixel backlit display or projection light valve is described, however, the teachings within allow the fabrication of ultra-high resolution displays exceeding that of HDTV (for example, EWS). At the periphery of the display area and electrically connected to the array of pixels is display driver circuitry 14 which supplies the appropriate voltages to the display rows and columns of pixels to address individual pixels which provide the image for viewing. This location and interconnection allow a full electrical addressing of the display or light valve and a monolithical integration for improved reliability and performance.

Display driver circuitry 14 employs complementary metal-oxide-semiconductor (CMOS) technology and is fabricated using the teachings herein on the improved UTSOS wafer. Additional VLSI signal processing, buffering, data decompression circuitry 16 and the like may also be integrated around a perimeter area of the display as called for by the job at hand. Means for the data (image) signal voltages to be delivered onto the monolithically integrated wafer from off-chip (wafer) connections 17, such as, appropriate leads, connectors and waveguides 18 is also provided to complete the display or light valve system. Untethered communications may be also implemented if desired. Untethered communications includes any form of electromagnetic input or output of information, including but not limited to radio frequency (RF), microwave, and optical data links.

Figure 2:
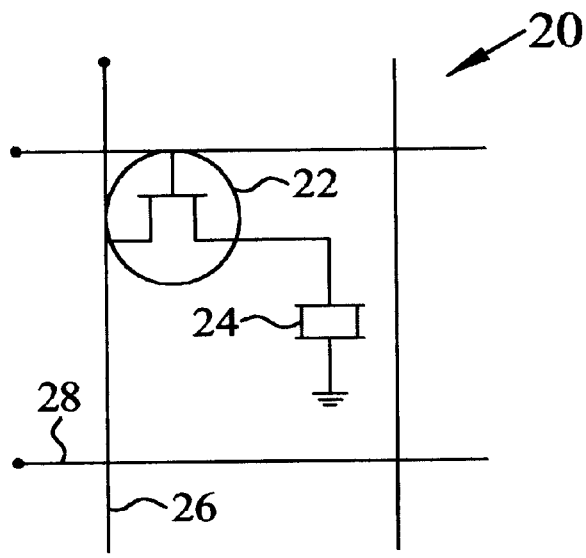
FIG. 2 shows the electrical schematic for a single picture element (pixel).

FIG. 2 shows an electrical schematic for a single picture element or pixel 20. In this invention the pixel includes a single nonlinear circuit element 22, a MOSFET in this case, and ha single nematic liquid crystal capacitor 24. Metal column line 26 and polysilicide row line 28 are appropriately connected to bias the MOSFET to vary the voltage on the nematic liquid crystal within the capacitor to achieve the desired gray scale.

In practice a single nonlinear element (TFT, MOSFET, or diode or the like) is not used due to the requirement of the prior art to have redundant circuitry to provide for satisfactory fabrication yields. The improved UTSOS material provides a single crystal silicon material in which highly reliable MOSFETs can be fabricated eliminating the requirement for redundancy. This capability results in an important reduction in the actual size of each pixel element compared to the prior art which results in substantial improvements in display density and brightness. Also, small nonlinear circuit elements (MOSFETs) can be fabricated on the UTSOS silicon layer which will achieve the same output current characteristics of larger TFTs due to the improved single-crystal structure, which provides for improved pixel scalability and aperture ratio.

Furthermore, the heretofore inability to use nematic liquid crystals for light-valve or display applications in silicon-on-sapphire (SOS) due to high leakage has been well documented by the prior art. Modifications to the device structure and the device architecture are required to allow the use of nematic liquid crystals with UTSOS technology. In accordance with this inventive concept, device modifications to inhibit leakage from the MOSFET at each pixel allowing little or no loss in voltage and corresponding gray-scale (or color) at the nematic liquid crystal capacitor involve the use of a combination of thick gate oxides, drain engineering using single or double lightly doped drains (LDD and DLDD), doped edges, edgeless devices or LOCal Oxidation of Silicon (LOCOS) for device isolation. The thicker oxide inhibits one potential path of charge leakage in the driving MOSFET. Increasing the oxide thickness to greater than 250 Å also may be used for the required reduction in leakage. The use of LDD or DLDD minimizes impact ionization by reducing the electric field at the drain(s). This also may be used for the required reduction in leakage. Doped edges, and LOCOS isolation inhibit leakage from the perimeter of edge of the device. Alternately, edgeless devices may be incorporated to reduce the leakage to satisfactory levels. Satisfactory levels are defined as leakage below 1 pA/$\mu$m. For example a MOSFET with a 1 $\mu$m gate width must have leakage at or below 1 pA for satisfactory performance.

MOSFETs fabricated in UTSOS in accordance with the herein disclosed process and having gate widths of 1 $\mu$m meet these requirements.

Figure 3:
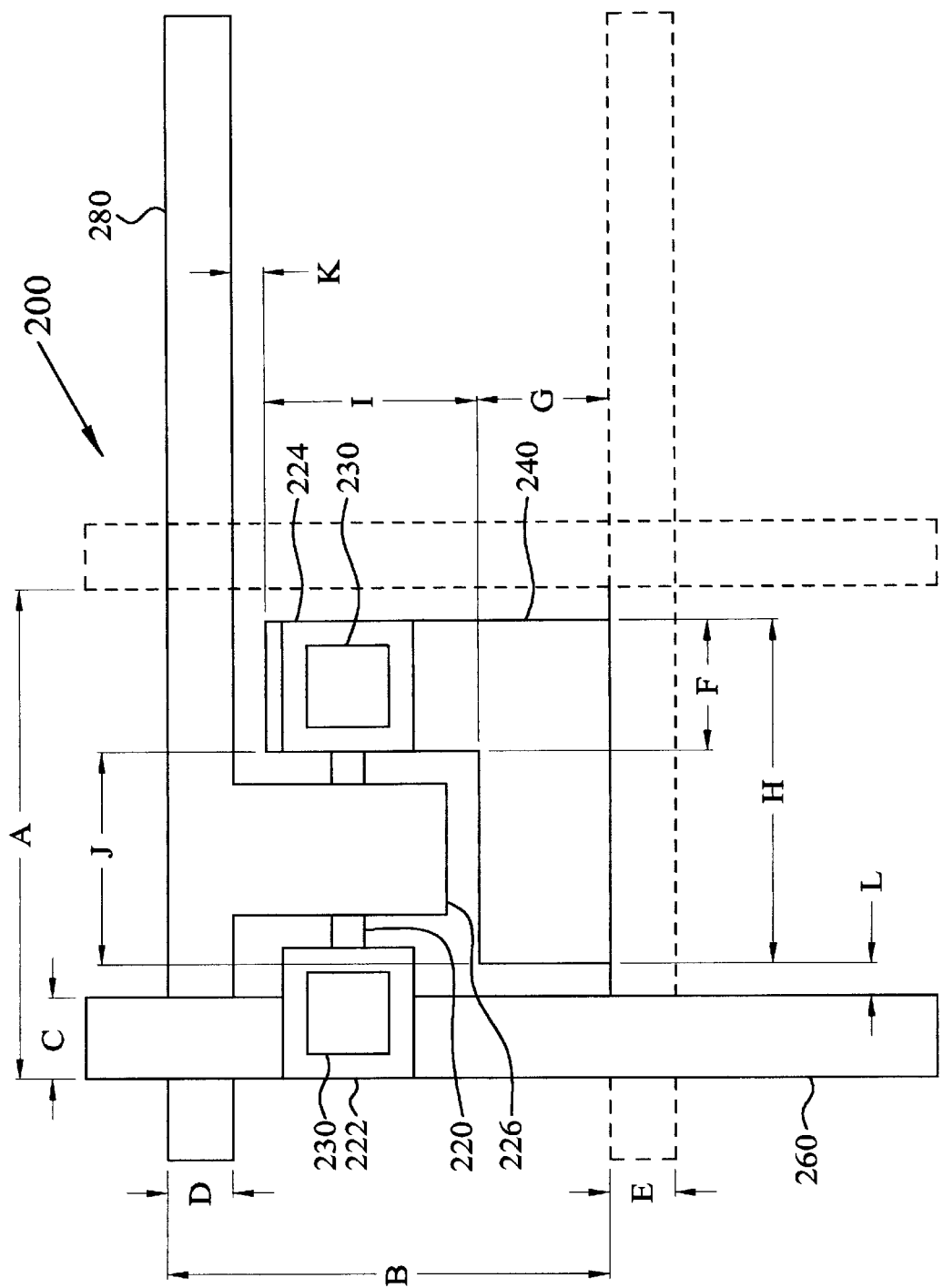
FIG. 3 shows the layout scheme for a single pixel.

FIG. 3 shows in detail the layout scheme for a single pixel 200 in accordance with this invention. A capacitor structure 240 is shown with a total area of less than 53 square microns, while the MOSFET 220 covers less than 70 square microns. A 2 micron wide polysilicide gate line 280 is electrically connected to gate structure 226 of the MOSFET to turn on or off the transistor as desired. A 2 micron wide metal data line 260 is electrically connected to MOSFET source 222, while the MOSFET drain 224 is electrically connected to nematic liquid crystal capacitor structure 240. Two micron contact holes 230 are used to electrically couple these structures together. Nematic liquid crystal capacitor structure 240 contains the nematic liquid crystal material (not shown in this figure) that undergoes variable switching in response to voltages applied to the capacitor structure that is consequently formed between laminae of the structure.

Typically, an entire pixel 200 is sized to be confined within a 12 micron by 12 micron area, and has a 37% aperture ratio. Exemplary dimensions may be: dimensions A and B equal to 12.0 microns, dimensions C, D, and E equal to 2.0 microns, dimensions F and G equal to 3.6 microns, dimension H equal to 8.8 microns, dimension I equal to 5.8 microns, dimension J equal to 5.2 microns and dimensions K and L equal to 0.6 microns. An advantage of this practical, simplified structure is the ready scalability of the structure for the job at hand. Table II shows the effect on the aperture ratio by scaling the pixel dimensions which may be desired to select or maximize the display brightness and resolution. Aperture ratios above 0.70 are desired for projection display applications to enhance the brightness of the projected image. Such large aperture ratios are readily achieved by the herein disclosed technology and represent a major advance over the prior art for transmissive displays or light valves.

TABLE II

SCALING OF PIXEL APERTURE RATIO

| Horizontal Dimension | Vertical Dimension | Aperture Ratio |
| --- | --- | --- |
| 10.0 | 10.0 | 0.19 |
| 11.5 | 11.5 | 0.33 |
| 12.0 | 12.0 | 0.37 |
| 15.0 | 15.0 | 0.52 |
| 20.0 | 20.0 | 0.67 |
| 25.0 | 25.0 | 0.75 |
| 30.0 | 30.0 | 0.79 |

Table III shows aperture ratios and pixel dimensions for prototype displays utilizing current state of the art polysilicon TFT technologies as reported by Takafuji et al., in an article entitled "A 1.9 in. 1.5 MPixel Driver Fully-Integrated Poly-Si TFT-LCD for HDTV Projection," in 1993 *SID International Symposium Digest of Technical Papers,* Vol. 24, pp. 383–386 (1993) and the Ohshima et al. paper, "Full-Color LCD's with Completely Integrated Drivers Utilizing Low-Temperature Poly-Si TFTs," in 1993 *SID International Symposium Digest of Technical Papers,* Vol. 24,, pp. 387–390 (1993). The significantly higher aperture ratios for UTSOS are due to the higher drive currents of the UTSOS devices which allows one to use smaller pixel MOSFETs.

TABLE III

PIXEL APERTURE RATIOS FOR TYPICAL POLY-SI TFT ACTIVE-MATRIX DISPLAYS

| Horizontal Dimension | Vertical Dimension | Aperture Ratio |
|---|---|---|
| 29.0 | 24.0 | 0.23 |
| 34.0 | 46.0 | 0.27 |

Figure 4:
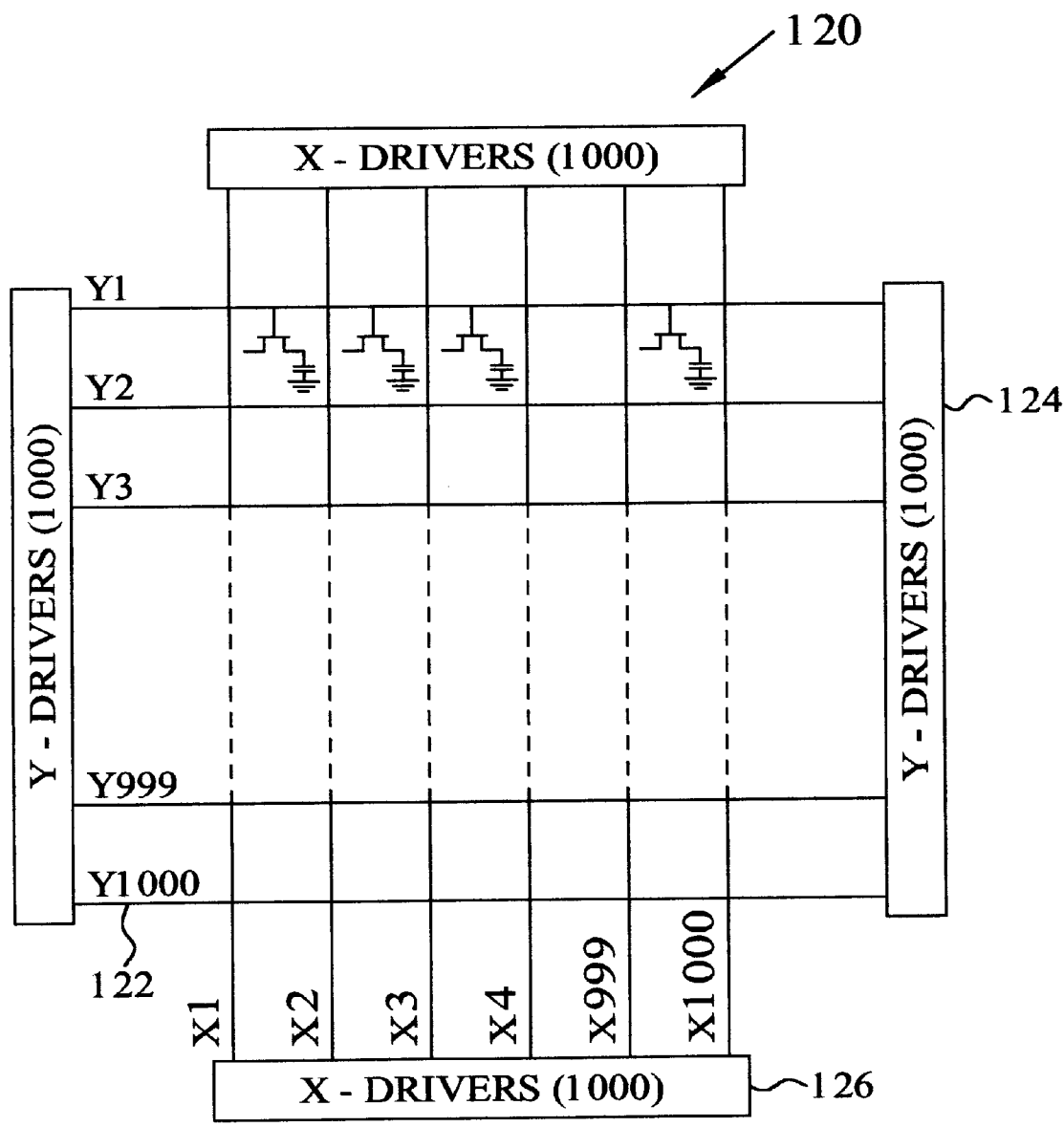
FIG. 4 schematically depicts a plurality of picture elements comprising the display.

FIG. 4 schematically depicts a plurality of picture elements making up display (or light valve) 120. In this embodiment, one million pixels are arranged in a 1000×1000 array 122 with row driver circuitry 124 and column 126 driver circuitry electrically connected to the pixels of the array. The row and column driver circuitry are functionally similar to that of the prior art except that high speed shift registers can be fabricated in the improved UTSOS material to rapidly clock data onto the display or light valve. This is a requirement to utilize the higher performance of UTSOS devices to mitigate leakage from the pixel MOSFET for controlling the nematic liquid crystal material. The high speed of the UTSOS devices may be used for rapid refreshing of the pixel array to inhibit loss of gray-scale (or color) for moderately sized displays.

The resulting synergistic advantages of the judicious coupling of high performance UTSOS electronics, low leakage UTSOS MOSFETs and nematic liquid crystals include the ability to time multiplex the liquid crystal capacitor on/off state. This results in an apparent "gray" or intermediate light levels between the normal "on/white" or "off/black" state in addition to the standard gray scales using intermediate voltages. The high speed operation of the monolithically integrated high performance UTSOS circuitry provides a larger range of gray scales than can be achieved with TFT or even bulk silicon technologies for monochrome display applications.

Another salient feature provided for by the high performance UTSOS circuitry is the improvement offered by multicolored displays using the high speed time multiplexing provided for by this invention. In some applications, three (or more) adjacent pixels may be functionally coupled to generate a colored image using red, green and blue dyes or filters. A major synergistic advantage provided for by the high performance UTSOS circuitry is the capability to time multiplex color through a single pixel. This can be accomplished by supplying a sequence of red, green and blue light (in accordance with photometric standards for the primary colors) by, for example, rotating a color wheel with appropriate filters interspersed between a white light source or by switching colored laser sources for illumination of the monolithically integrated display or light valve with associated circuitry described herein, i.e the display system 10 in FIG. 1.

The judicious coupling of the time multiplexed display/light-valve with an appropriately timed and phased three color light source eliminates the need to install filters on the display/light-valve thereby reducing fabrication cost and increasing brightness. This invention also provides a reduction in the number of pixels required to display a multicolor image by (at least) a factor of three. In combination with the size reductions allowed by the superior pixel layout afforded by the improved UTSOS material, substantial downsizing and simplifying of the display or light valve can be obtained. The cumulative advantage is the ability to fabricate ultrahigh resolution displays and light valves and increase the effective array area of the display or light valve.

It should be noted that a major improvement over the prior art is achieved using UTSOS and the teachings disclosed herein. The ultrathin silicon layer is resistant to light induced leakage due to the low cross-section for absorption of incident light. The low cross-section produces low levels of photogenerated charge carriers as compared to the prior art. This feature allows illumination with brighter light sources than the prior art. This feature and its attendant advantages apply for both transmissive and reflective mode displays/light-valves. A salient advantage that might be overlooked is that the insensitivity to the illuminated light allows the design of larger aperture ratios and the elimination of protective light (masking) layers if desired. The ultrathin single crystal silicon layer is at or below 100 nm in thickness.

FIGS. 5A, 5B, 5C, 5D, 5E, 5F, 5G and 5H schematically show the integrated fabrication process for the nematic liquid crystal display or light valve and its associated circuitry. The general method for fabricating the ultra-high resolution display or light valve system in UTSOS allows the monolithic simultaneous fabrication of the display as well as all associated electronics as schematically shown in FIG. 1.

For clarity and for purposes of demonstration, only the simplest picture element or pixel is shown which includes a single nonlinear circuit element, a low leakage MOSFET, and a single nematic liquid crystal capacitor. When following the process steps detailed below, a plurality or multitude of such pixels can be configured and interconnected with drive and image processing circuitry using appropriately designed photolithographic masks.

Figure 5A:
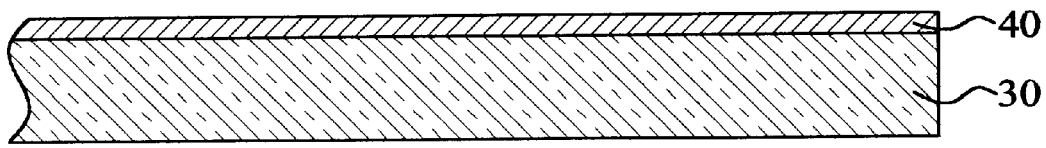
FIGS. 5A, 5B, 5C, 5D, 5E, 5F, 5G and 5H schematically show the integrated fabrication process for the nematic liquid crystal display and its associated circuitry.
Figure 5B:
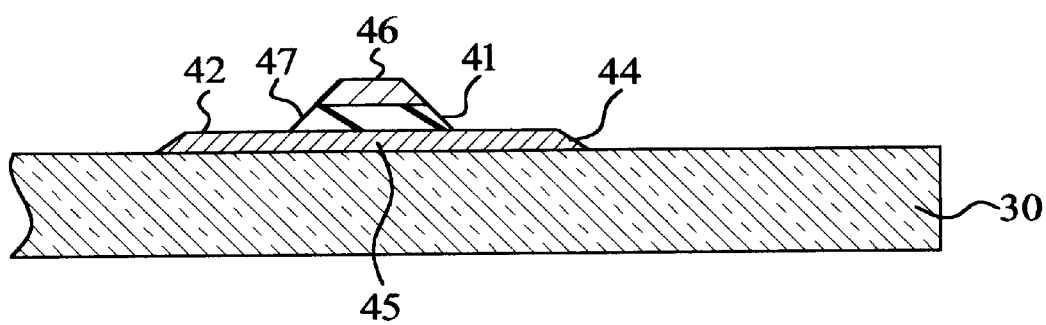

The starting material is a sapphire ($Al_2O_3$) substrate 30 in the form of a wafer that is topped with a thin layer of device quality silicon 40, see FIG. 5A. One method to achieve this is by epitaxial deposition of silicon by thermal decomposition of silane and subsequent ion implantation and solid phase regrowth techniques. This method uses an ion implantation of $^{28}Si$ atoms (doses on the order of $10^{14}$ $cm^{-2}$ at 185 keV) into the near interfacial region of the silicon-sapphire interface while the temperature of the wafer is maintained at −20 degrees C. Ion implanting any species with a mass of about that of $^{28}Si$ may also be employed without substantially changing the remaining process parameters. Species of substantially different masses such as ions or complexes of tin (Sn), germanium (Ge) or carbon (C) may also be used by appropriately varying the implant parameters. Suitably removing excess silicon follows.

The silicon is thermally annealed at 900° C. in nitrogen for one hour after a soak for about 30 minutes at 550 degrees C and a thermal ramp over the course of an hour from 550 degrees C to 900 degrees C. The silicon is then oxidized at 1000° C. which consumes a portion of the silicon layer. The oxide is subsequently etched leaving a silicon layer of reduced thickness. The oxidation and etch process can be repeated to obtain a layer less than 100 nm thick (nominally 30 to 100 nm) of silicon, i.e. an ultrathin film of single crystal device quality silicon on sapphire. This starting material forms the basis for the optical, mechanical, electrical and thermal advantages over the prior art. In particular, a salient feature resulting from the fabrication of the display in less than 100 nm thick silicon films rather than thick films (>100 nm) of silicon-on-sapphire as taught in the prior art offers substantial improvement in absorption (i.e. increased brightness), resistance to heating and parasitic photoexcited carriers.

Next, the single nonlinear circuit element, a MOSFET, is fabricated in each pixel on the thin film silicon layer. In the preferred embodiment, the pixel MOSFET width is sized to achieve the desired low leakage to achieve satisfactory gray levels with nematic liquid crystals. Simultaneously, a plurality of MOSFETs and related circuit elements are fabricated forming the associated circuits using suitably designed photolithographic masks. A series of fabrication steps that are a modification of a conventional self-aligned thin film transistor fabrication process for a MOSFET is employed. The series includes: patterning a first portion of the thin film silicon layer (using lithographic and etching techniques), growing gate oxide by exposing wafers to an oxygen ambient at an elevated temperature, depositing polysilicon (i.e. polycrystalline silicon) by chemical vapor deposition (CVD), doping the polysilicon in-situ during deposition, implanting dopant ions or diffusing by high temperature dopants from a deposited glass, patterning polysilicon (by similar lithographic and etch techniques used above), selectively doping the source and drain regions of the MOSFETs by ion implanting and annealing at elevated temperatures, and depositing and patterning of an oxide layer to form a sidewall oxide, which results in the self-aligned structure seen in FIG. 5B. The doped polysilicon is a conductive material which forms the gate electrode. This MOSFET structure contains the gate oxide 41, source region 42, drain region 44, channel region 45, gate electrode 46 and sidewall oxide 47.

At this stage improved contacts may be formed, if desired, using silicidation techniques. This involves depositing a suitable metal, e.g. titanium, and rapid thermal annealing of the wafer which provides for the formation of a low resistivity metal silicide contact in the areas where the metal was in contact with polysilicon (the source and drain regions of the MOSFETs) and the gate electrode. The metal which is not in contact with polysilicon and the gate electrode is unreacted, and subsequently etched from the wafer.

Figure 5C:
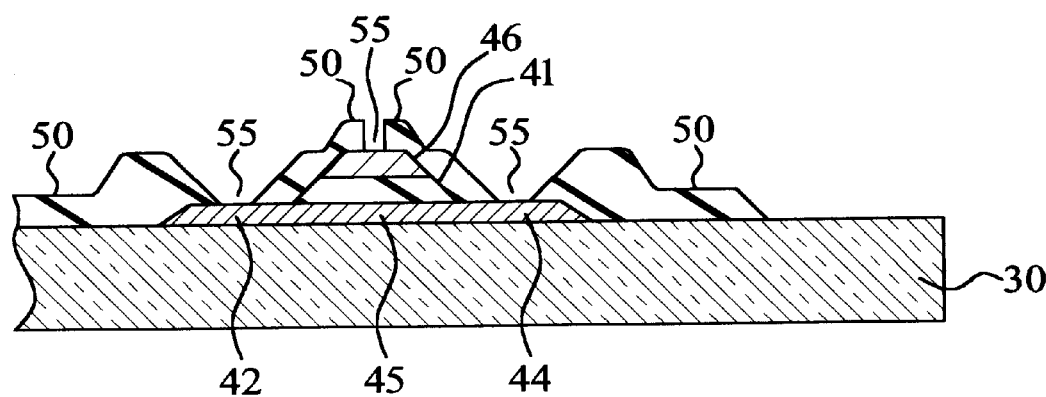

The process continues with depositing passivation oxide 50 by CVD and patterning contact holes 55 in the oxide (by same methods used above) to make contact with the source region 42, drain region 44 and gate region (via gate electrode 46), see FIG. 5C.

Figure 5D:
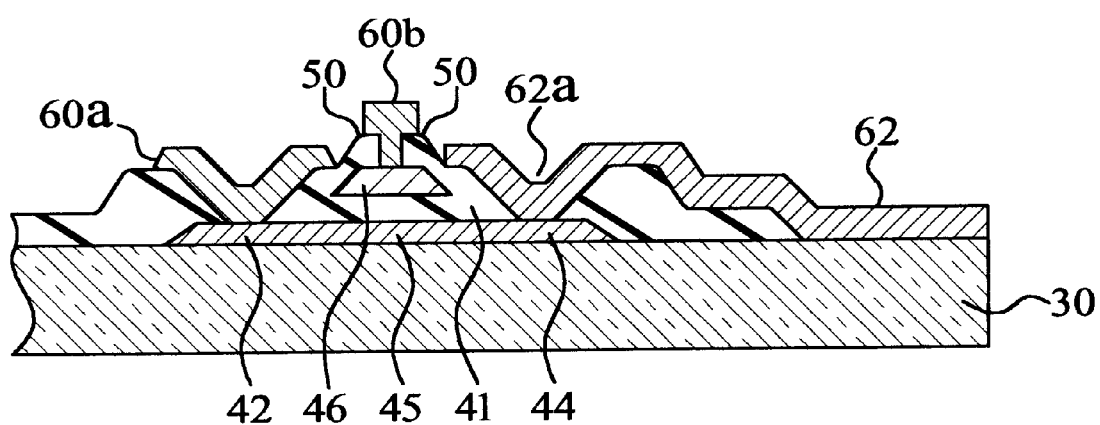
Figure 5E:
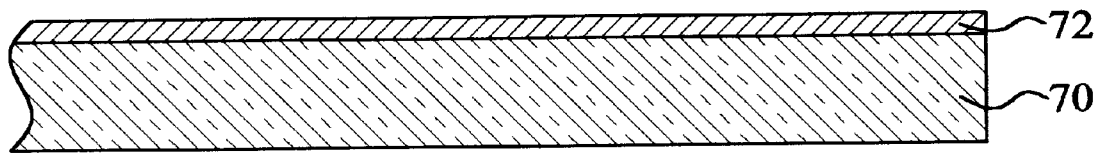
Figure 5F:
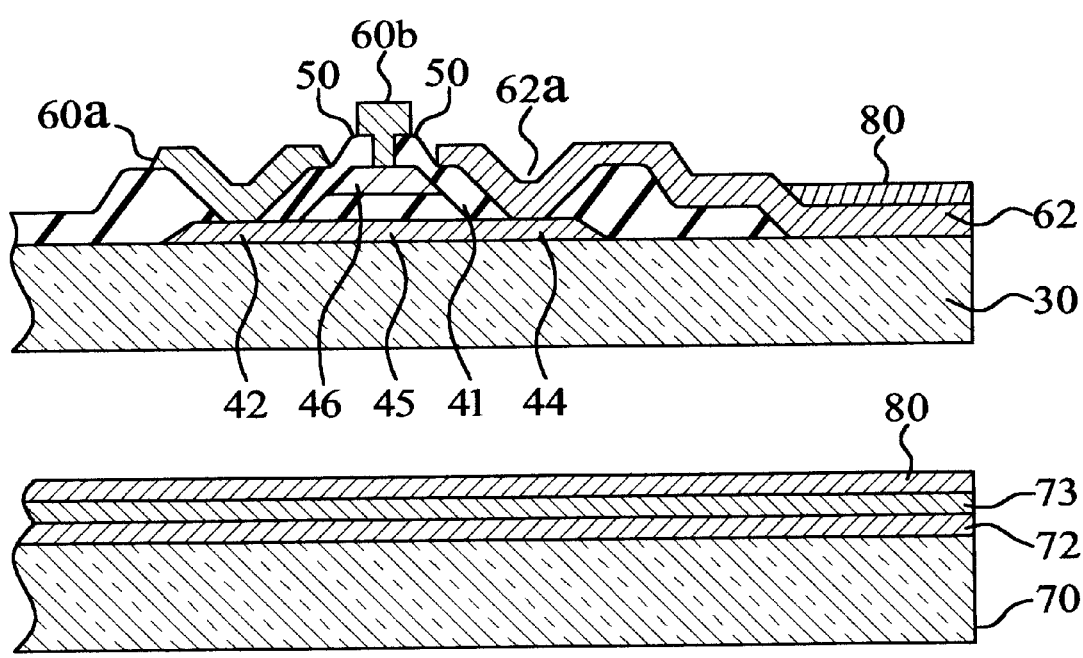
Figure 5G:
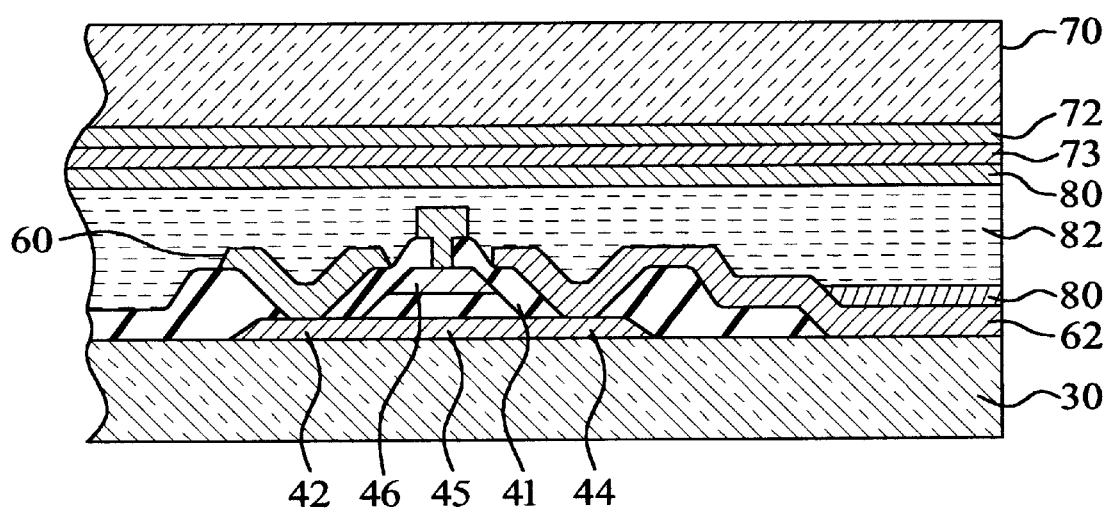

Depositing and patterning interconnect metallization follows with the resulting structure shown in FIG. 5D. The interconnect metallization may itself be the product of a multiple step process. For example, an aluminum alloy (99%Al:1%Si) may be deposited and patterned for all contacts including source contact 60*a,* gate contact 60*b,* and interconnections with the silicon MOSFETs and related devices and circuits. A transparent conductive material such as indium tin oxide (ITO) may be subsequently deposited and patterned as a transparent drain contact 62*a* that also extends as a transparent nematic liquid crystal capacitor contact or electrode 62 for a nematic liquid crystal capacitor to be described, (the interconnect metallization also forms the output electrode from the MOSFET to pixel electrode 62). The transparent nematic liquid crystal capacitor electrode 62 is required when the display system 10 is used in a transmissive mode. However, for a reflective mode display or light-valve system, the nematic liquid crystal capacitor electrode may be an opaque metal (such as Al or 99%Al:1%Si) as this forms a back reflector for the system. In such an embodiment, the spacing between the nematic liquid crystal capacitor electrodes is appropriately modified to accommodate the desired path length in the liquid crystal medium. Adjusting the spacing of the capacitor electrodes is practiced in the art of liquid crystal displays.

At this stage of the process, the monolithically integrated circuitry and the MOSFETs at each pixel are completely fabricated and may, if desired, be covered with additional passivation, shielding or planarization layers useful in certain applications. A corresponding transparent substrate 70, e.g. sapphire, quartz, fused silica or glass, also is covered with a transparent metallized counter electrode 72, and appropriately patterned if desired, see FIG. 5E. This counter electrode is normally common for the entire pixel array. Looking to FIG. 5F, if desired, a means for colored display 73 may be included, for example by attachment of a colored filter, or incorporation of a colored dye and the like on the counter electrode (or alternately on the substrate with the circuitry). Alignment layers 80 are then formed on the pixel electrodes, if desired. This can entail the deposition of a thin layer of polyimide which is subsequently mechanically rubbed to obtain a preferred orientation for the liquid crystal media. The process for forming alignment layers is well known in the art of liquid crystals and variations are readily accommodated by this fabrication process.

Figure 5H:
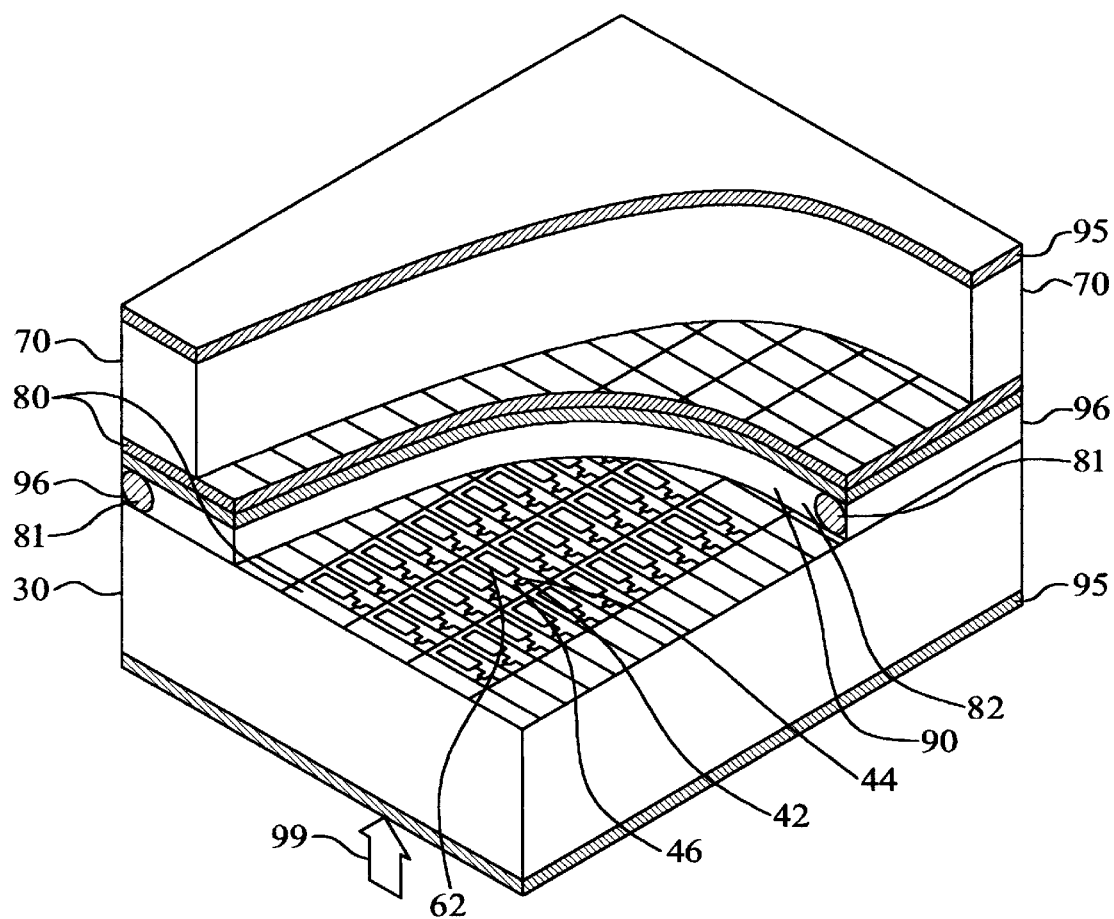

A means to appropriately space each pixel electrode 62 from counter electrode 72 is provided using, for example, fiber glass spacer rods or beads 81, see FIG. 5H such as practiced in the art. This spacer means normally lies at the periphery of the chip. Final assembly requires appropriately adjoining of substrate 30 at its respective appropriate predetermined portions with substrate 70 at its respective appropriate predetermined portions forming a cavity 82, vacuum filling of the cavity with desired liquid crystal material 90, and hermetically sealing or plugging the cavity, schematically depicted by the flat closures 96, it being understood that this configuration is for the purposes of demonstration only, see FIG. 5G and FIG. 5H. One skilled in the art to which this invention pertains would be apprised of appropriate closure configurations and techniques for accomplishing same.

The nematic liquid crystal material used to fill the cavity is any of those that is practiced in the art. Affixing appropriately oriented polarizers 95 to the front and back surfaces finalizes the fabrication of the monolithic display system, see cutaway plan-view in FIG. 5H which shows a plurality of the pixels arrayed in the form of a display.

The display described above may be used for a direct view application such as in a head-mounted system or as a viewfinder on a camcorder. For a projection system this array could be used as a light valve. A light blocking layer or other means for blocking light may be fabricated above the switching transistor to shield the transistor from most of the light and thereby lower the photo-induced leakage current. This, however, could be eliminated if the job at hand does not require a high brightness image. Both transmissive and reflective mode displays or light valves can be readily fabricated by the teachings herein and can be accommodated for the particular job at hand as described above.

The above teachings detail the invention as a backlit or projection display with light 99 coming from one side of the display. The display area is an active-matrix display using a plurality of pixels in an array compatible with HDTV and other ultra-high resolution displays (1000×1000 pixels or more). Each pixel uses a single MOSFET fabricated in UTSOS as the nonlinear element and an adjacent nematic liquid crystal capacitor which is switched by the MOSFET. The use of time multiplexing to achieve colors or additional gray-scales may exploit future advances in high speed liquid crystals utilizing the high speed performance of UTSOS devices to drive very large displays. The small size and reliability of the MOSFET which can be fabricated in accordance with the inventive concept in ultra-thin single crystal SOS eliminates the need for redundant nonlinear elements thereby reducing the pixel size yet increasing the display brightness. Noting FIG. 1, row and column drivers 14 are integrated in the UTSOS wafer 11 adjacent to display area 12 to address the source and gate portions in the display area. These drivers consist of shift registers which sequentially clock on the signal voltage to the appropriately selected pixels. The design and architecture of shift registers are well known to those skilled in the art of electrical design, however the advantages of UTSOS provides for very high speed performance due to the elimination of parasitic capacitances from the devices to the substrate. Additional VLSI circuitry can be included monolithically on-chip (on the wafer) to control external component driving and synchronization/timing for example when using a color scheme with external time multiplexing. This is only possible due to the high quality material and high speed devices available with UTSOS.

While the herein disclosed teachings provide for circuits and devices with leakages at or below the benchmark 1 pA/micron desired for active-matrix operation with nematic liquid crystals, utilization of the herein disclosed teachings for integration of passive displays with their associated signal processing or active addressing circuitry is also envisioned.

An alternative embodiment of the herein described invention may utilize a thin film capacitor within the pixel to store charge and reduce the effects of charge leakage from the nematic liquid crystal capacitor. This is readily integrated into the aforementioned fabrication process using additional deposition, patterning and metallization steps as required and practiced in the art of microelectronic fabrication. See a schematic pixel layout shown if FIG. 6.

Figure 6:
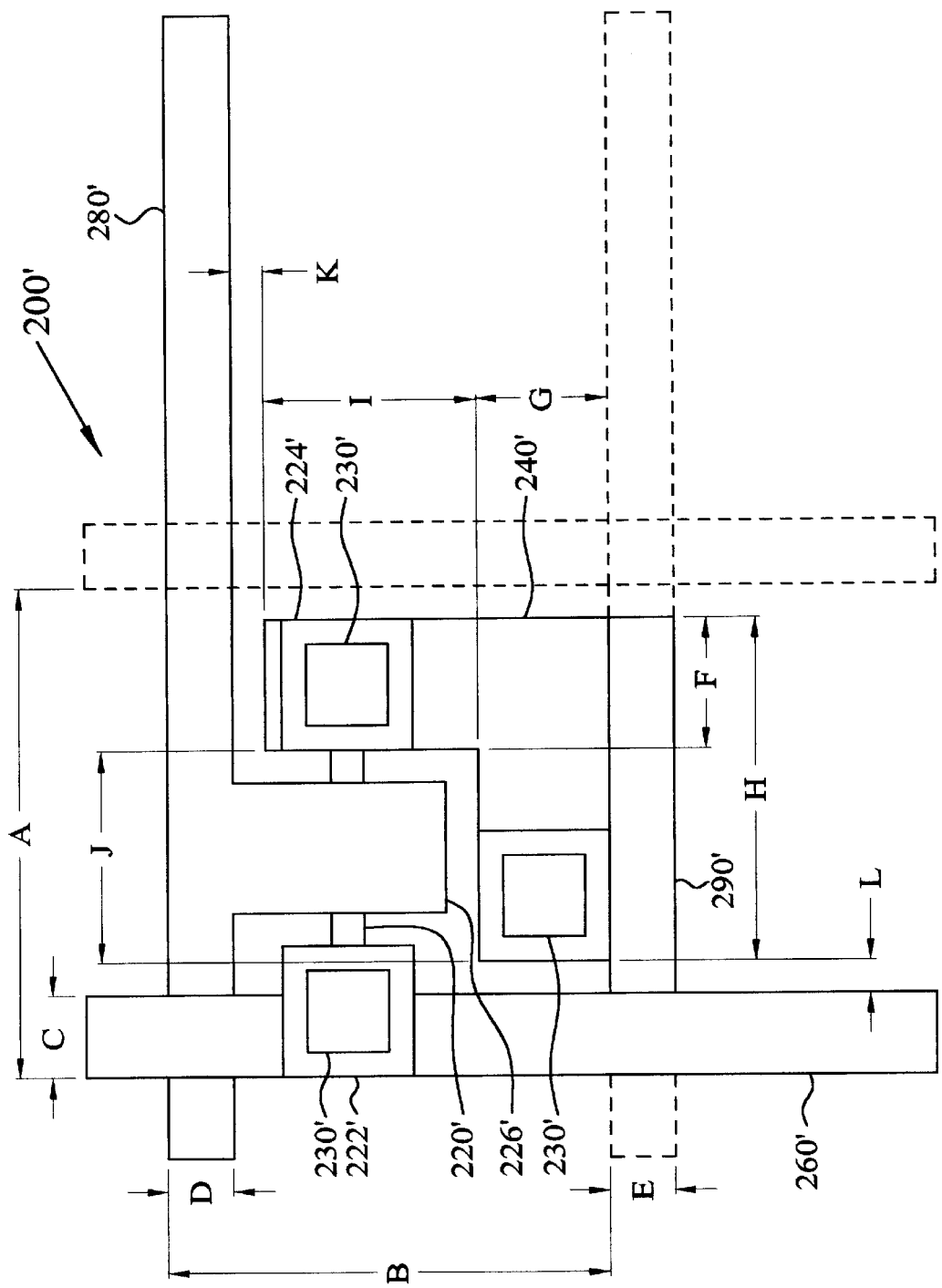
FIG. 6 shows an alternate layout scheme for a single pixel.

FIG. 6 shows in detail the layout scheme for a single pixel 200' in accordance with this invention. A capacitor structure 240' is shown with a total area of less than 53 square microns, while the MOSFET 220' covers less than 70 square microns. A 2 micron wide polysilicide gate line 280' is electrically connected to gate structure 226' of the MOSFET to turn on or off the transistor as desired. A 2 micron wide metal data line 260' is electrically connected to MOSFET source 222', while the MOSFET drain 224' is electrically connected to nematic liquid crystal capacitor structure 240'. Two micron contact holes 230' are used to electrically couple these structures together. Nematic liquid crystal capacitor structure 240' contains the nematic liquid crystal material (not shown in this figure) that undergoes variable switching in response to voltages applied to the capacitor structure that is consequently formed between laminae of the structure. This pixel architecture modification uses the additional thin film capacitor 290' in each pixel of the active-matrix array. This thin film capacitor is used to store sufficient charge to maintain the gray-level (or color) of the nematic liquid crystal capacitor even if the nonlinear electrical element (MOSFET) in the active-matrix leaks charge. This storage capacitor is designed to have high capacitance, but not be prohibitive in size such that it has detrimental effect on the aperture ratio on the display or light-valve. In this design, the thin film storage capacitor has dimensions of 8.8 $\mu$m×2 $\mu$m. The storage capacitor may use any high dielectric material such as silicon dioxide, silicon nitride, silicon oxynitride, ceramic ferroelectrics such as barium strontium titanate (BST) and the like. This advantage is amenable with future advances in high speed nematic liquid crystal materials. Note, MOSFET 220' shown in FIG. 6 has a width of 3 $\mu$m. This is larger in dimension and has a corresponding higher electrical leakage (which scales with device width) than MOSFET 220 in FIG. 3. The improved pixel architecture provided by thin film capacitor 290' in FIG. 7 allows design improvements when high drive currents offered by the wider MOSFET are desired by the job at hand but one must mitigate leakage for nematic liquid crystal applications.

This invention provides both a transparent substrate and bulk-silicon-like, single crystal, device quality semiconductor material for fabrication of high density circuitry. In addition with increased functionality of the display system by monolithically integrating VLSI circuitry including video drivers, analog-to-digital converters, digital logic and the like, there is a concomitant improvement in reliability because of fewer connections and wire bonds. This results in higher fabrication yields and lower system costs. The use of CMOS technology detailed herein also offers low power consumption important for battery operated display systems. Moreover, the high speed electronics of UTSOS are amenable with future advances in liquid crystal chemistry which continue to seek even faster switching and may be readily utilized.

In accordance with this inventive concept, the electrical signal voltage received on-chip undergoes data decompression and related image processing in monolithically adjacent low leakage VLSI circuitry fabricated in UTSOS and is matched with nematic liquid crystal materials for optimal performance obtained by the synergism of the combined technologies to produce salient advantages that can not be achieved by the prior art of display technology.

Figure 7:
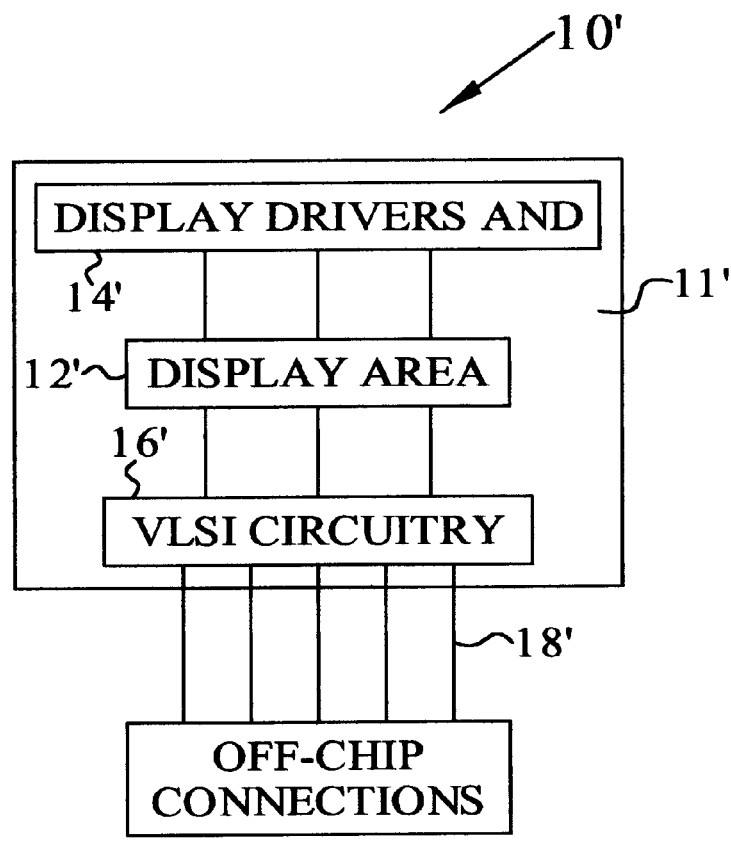
FIG. 7 schematically shows a ferroelectric liquid crystal display monolithically integrated with associated circuitry on an improved-UTSOS wafer.

Referring to FIG. 7 et seq., the disclosed invention calls for a display system 10' of a ferroelectric liquid crystal (FLC) display monolithically integrated with associated drive circuitry and image processing electronics on an improved ultrathin silicon-on-sapphire (UTSOS) wafer 11' and the method for fabricating the integrated structure. The description below will point out the salient features of this invention and its advantages over the teachings of the prior art. Starting from improvements to the basic building block, the picture element (pixel), and up through the improved fully integrated structure, the advantages of this invention will be apparent alone and in combination. Therefore, the synergistic combination of our teachings will be shown to be unobvious and a significant advance to the prior art. Salient advantages of the herein described invention over the prior art will also become apparent from review of the specification and figures. One such advantage of the herein disclosed and claimed inventive process allows the fabrication of devices and circuits in a thinner silicon layer (ultrathin silicon-on-sapphire or UTOS). Electronic devices and circuits fabricated in this thinner silicon layer can be operated in fully depleted mode and do not require body ties for improved performance and design. The thinner crystalline silicon layer of the disclosed and claimed invention herein will also be important for projection applications since the thinner silicon absrobs less light and the devices will have lower light-induced leakage currents. Furthermore, the ultrathin silicon layers of the herein dislcosed and claimed invention assure reduced carrier lifetime and reduced light-induced leakage with respect to such parameters in bulk silicon or ISE silicon layers. Additionally, the thermal conductivity of sapphire in accordance with the disclosed and claimed invention herein is much hight than glass, quartz or epoxy envisioned by the prior art and therefore the herein disclosed and claimed invention devices will not exhibit a descrease in current in the saturation region, a phenomenon known as self heating.

FIG. 7 schematically shows a display system 10' with the top view ferroelectric liquid crystal display monolithically integrated with associated circuitry on an improved-UTSOS wafer 11'. A display area 12' in display system 10' has an array of picture elements (pixels) which provide the image for viewing. In the preferred embodiment, a 1000 pixel× 1000 pixel backlit display is described, however the teachings within allow the fabrication of ultra-high resolution displays exceeding that of HDTV. At the periphery of the display area and electrically connected to the array of pixels are a display driver circuitry 14' which supplies the appropriate voltages to the display rows and columns of pixels to address individual pixels which provide the image for viewing.

Display driver circuitry 14' employs complementary metal-oxide-semiconductor (CMOS) technology and is fabricated using the teachings herein on the improved UTSOS wafer. Additional VLSI signal processing, buffering, data decompression circuitry 16' and the like may also be integrated around a perimeter area of the display as called for by the job at hand. Means for the data (image) signal voltages to be delivered onto the monolithically integrated wafer from off-chip (wafer) connections. 17', such as, appropriate leads, connectors and waveguides 18' is also provided to complete the display system. Untethered communciations also may be implemented if desired. Untethered communications include any form of electromagnetic input or output of information, including but not limited to radio frequency (RF), microwave, and optical data links.

Figure 8:
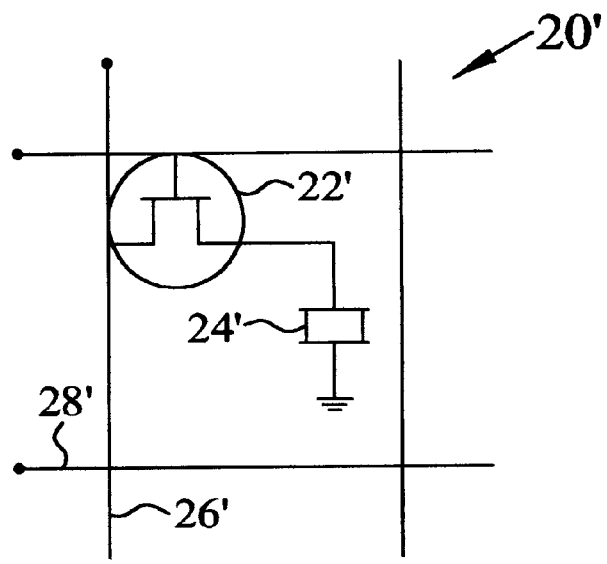
FIG. 8 shows the electrical schematic for a single picture element (pixel).

FIG. 8 shows an electrical schematic for a single picture element or pixel 20'. In this invention the pixel includes a single nonlinear circuit element 22', a MOSFET in this case, and a single ferroelectric liquid crystal capacitor 24'. Metal column line 26' and polysilicide row line 28' lines are appropriately connected to bias the MOSFET to switch the state of the ferroelectric liquid crystal within the capacitor. While the schematic of FIG. 8 is equivalent schematically to that shown in the prior art, in practice a single nonlinear element (TFT, MOSFET, diode or the like) is not used due to the requirement of the prior art to have redundant circuitry to provide for satisfactory fabrication yields. The improved UTSOS material provides a single crystal silicon material in which highly reliable MOSFETs can be fabricated eliminating the requirement for redundancy. This capability results in an important reduction in the actual size of each pixel element compared to the prior art and results in substantial improvements in display density and brightness.

Figure 9:
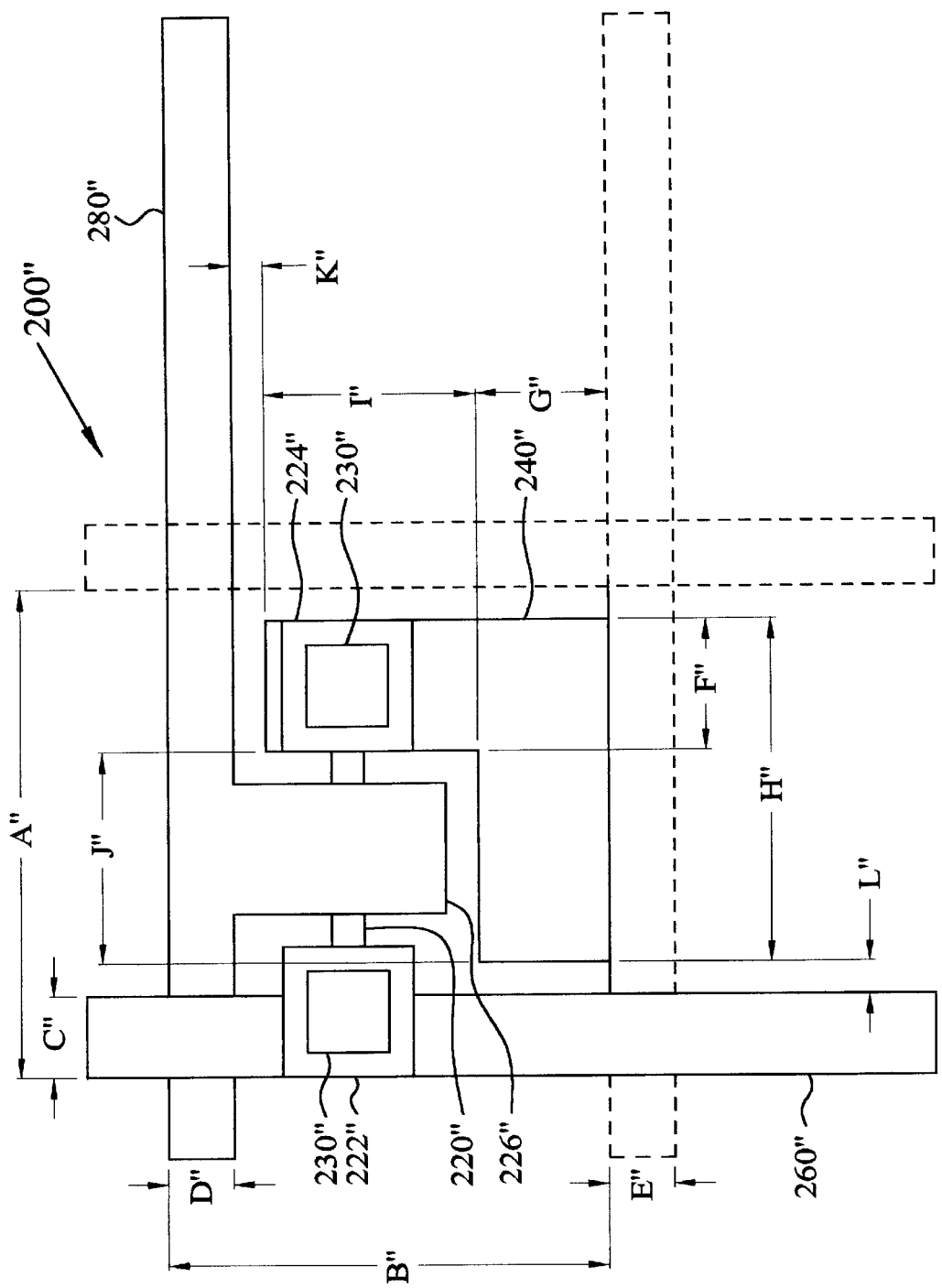
FIG. 9 shows the layout scheme for a single pixel.

FIG. 9 shows in detail the layout scheme for a single pixel 200" in accordance with this invention. A capacitor structure 240" is shown with a total area of less than 53 square microns, while the MOSFET 220" covers less than 70 square microns. A 2 micron wide polysilicide gate line 280" is electrically connected to gate structure 226" of the MOSFET to turn on or off the transistor as desired. A 2 micron wide metal data line 260" is electrically connected to MOSFET source 222", while the MOSFET drain 224" is electrically connected to ferroelectric liquid crystal capacitor structure 240". Two micron contact holes 230" are used to electrically couple these structures together. Ferroelectric liquid crystal capacitor structure 240" contains the ferroelectric liquid crystal material (not shown in this figure) that undergoes bistable switching in response to voltages applied to the capacitor structure that is consequently formed between laminae of the structure.

Typically, an entire pixel 200" is sized to be confined within a 12 micron by 12 micron area, and has a 37% aperture ratio. Exemplary dimensions may be: dimensions A" and B" equal to 12.0 microns, dimensions C", D", and E" equal to 2.0 microns, dimensions F" and G" equal to 3.6 microns, dimension H" equal to 8.8 microns, dimension I" equal to 5.8 microns, dimension J" equal to 5.2 microns and dimensions K" and L" equal to 0.6 microns. An advantage of this practical, simplified structure is the ready scalability of the structure for the job at hand. Table II' shows the effect on the aperture ratio by scaling the pixel dimensions which may be desired to select or maximize the display brightness.

TABLE II'

SCALING OF PIXEL APERTURE RATIO

| Horizontal Dimension | Vertical Dimension | Aperture Ratio |
| --- | --- | --- |
| 10.0 | 10.0 | 0.19 |
| 11.5 | 11.5 | 0.33 |
| 12.0 | 12.0 | 0.37 |
| 15.0 | 15.0 | 0.52 |
| 20.0 | 20.0 | 0.67 |
| 25.0 | 25.0 | 0.75 |
| 30.0 | 30.0 | 0.79 |

Table III' shows aperture ratios and pixel dimensions for prototype displays utilizing current state of the art polysilicon TFT technologies as reported by Takafuji et al., in an article entitled "A 1.9 in. 1.5 MPixel Driver Fully-Integrated Poly-Si TFT-LCD for HDTV Projection," in 1993 *SID International Symposium Digest of Technical Papers* Vol. 24, pp. 383–386 (1993) and the Ohshima et al. paper, "Full-Color LCD's with Completely Integrated Drivers Utilizing Low-Temperature Poly-Si TFTs," in 1993 *SID International Symposium Digest of Technical Papers,* Vol. 24,, pp. 387–390 (1993). The significantly higher aperture ratios for UTSOS are due to the higher drive currents of the UTSOS devices which allows one to use smaller pixel MOSFETs.

TABLE III'

PIXEL APERTURE RATIOS FOR TYPICAL POLY-SI TFT ACTIVE-MATRIX DISPLAYS

| Horizontal Dimension | Vertical Dimension | Aperture Ratio |
| --- | --- | --- |
| 29.0 | 24.0 | 0.23 |
| 34.0 | 46.0 | 0.27 |

Figure 10:
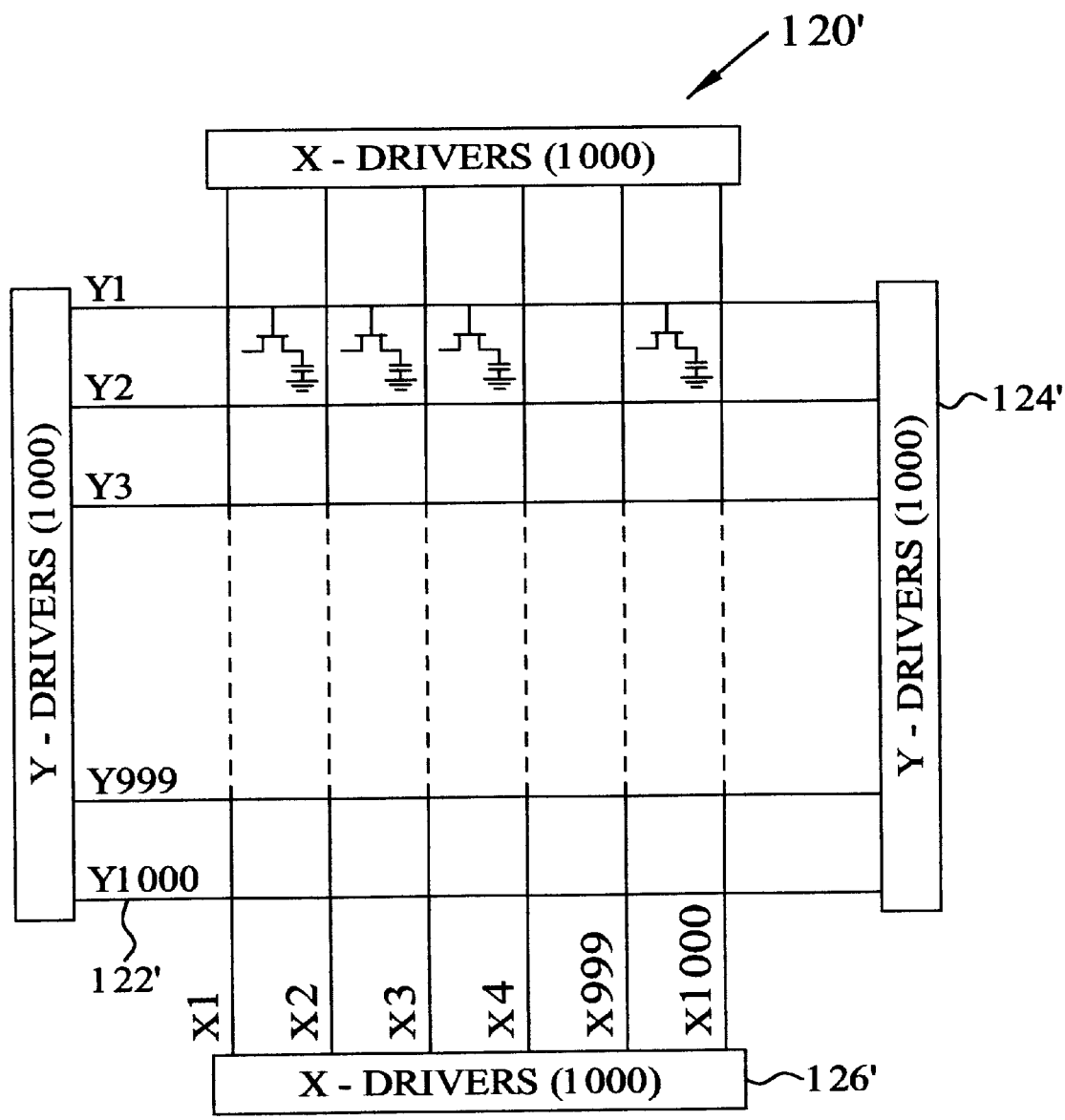
FIG. 10 schematically depicts a plurality of picture elements comprising the display.

FIG. 10 schematically depicts a plurality of picture elements making up display 120'. In this embodiment, one million pixels are arranged in a 1000×1000 array 122' with row driver circuitry 124' and column 126' driver circuitry electrically connected to the pixels of the array. The row and column driver circuitry are functionally similar to that of the prior art except that high speed shift registers can be fabricated in the improved UTSOS material to rapidly clock data onto the display. This is a requirement to optimally utilize the high switching speed of the ferroelectric liquid crystal material (as opposed to twisted nematics) which is not suggested by the prior art.

The resulting synergistic advantages of the judicious coupling of high performance UTSOS electronics and ferroelectric liquid crystals results in the ability to time multiplex the on/off state of the ferroelectric capacitor. This results in an apparent "gray" or intermediate light levels between the normal bistable "on/white" or "off/black" state. The high speed operation of the monolithically integrated high performance UTSOS circuitry provides a larger range of gray scales than can be achieved with TFT or even bulk silicon technologies for monochrome display applications.

Furthermore, the bistable (digital) switching of the FLC using monolithically integrated high performance UTSOS circuitry avoids problems found with active-matrix displays using nematic liquid crystals. Using nematic liquid crystals, where off-state or reverse-bias leakage through the nonlinear circuit element results in partial rotation of the nematic liquid crystal, causes unwanted changes in gray level. Device leakage has a minimal effect on FLC since only large levels of leakage, exceeding the threshold for complete switching, will effect the light level through the FLC pixel.

Another salient feature provided for by the high switching speed of ferroelectric liquid crystals and the high performance UTSOS circuitry is the improvement offered by multicolored displays using the high speed time multiplexing provided for by this invention. In some applications, three (or more) adjacent pixels may be functionally coupled to generate a colored image using red, green and blue dyes or filters. A major synergistic advantage provided for by the high switching speed of ferroelectric liquid crystals and the high performance UTSOS circuitry is the capability to time multiplex color through a single pixel. This can be accomplished by supplying a sequence of red, green and blue light (in accordance with photometric standards for the primary colors) by, for example, rotating a color wheel with appropriate filters interspersed between a white light source for back illumination and the monolithically integrated display with associated circuitry described herein, i.e the display system 10' in FIG. 7. This invention therefore provides a reduction in the number of pixels required to display a multicolor image by (at least) a factor of three. In combination with the size reductions allowed by the superior pixel layout afforded by the improved UTSOS material, substantial downsizing and simplifying of the display can be obtained. The cumulative advantage is the ability to fabricate ultra-high resolution displays and increase the effective array area of the display.

FIGS. 11A, 11B, 11C, 11D, 11E, 11F, 11G and 11H schematically show the integrated fabrication process for the ferroelectric liquid crystal display and its associated circuitry. The general method for fabrication of the ultra-high resolution display system in UTSOS allows the monolithic simultaneous fabrication of the display as well as all associated electronics as schematically shown in FIG. 7.

For clarity and for purposes of demonstration, only the simplest picture element or pixel is shown which includes a single nonlinear circuit element, a MOSFET, and a single ferroelectric liquid crystal capacitor. When following the process steps detailed below, a plurality or multitude of such pixels can be configured and interconnected with drive and image processing circuitry using appropriately designed photolithographic masks.

Figure 11:
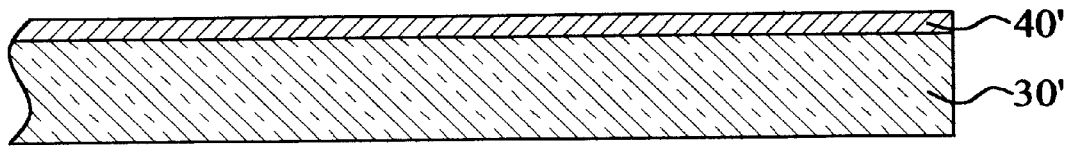
FIGS. 11A, 11B, 11C, 11D, 11E, 11F, 11G and 11H schematically show the integrated fabrication process for the ferroelectric liquid crystal display and its associated circuitry with FIG. 11H isometrically, schematically depicting a typical fabricated display.
Figure 11:
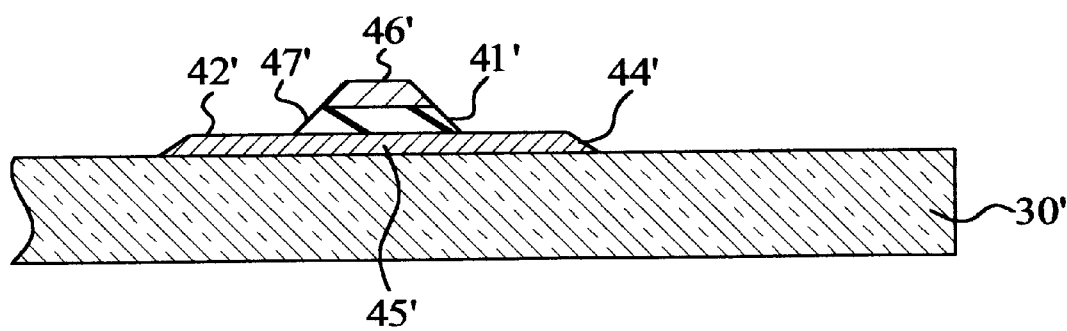
Figure 11:
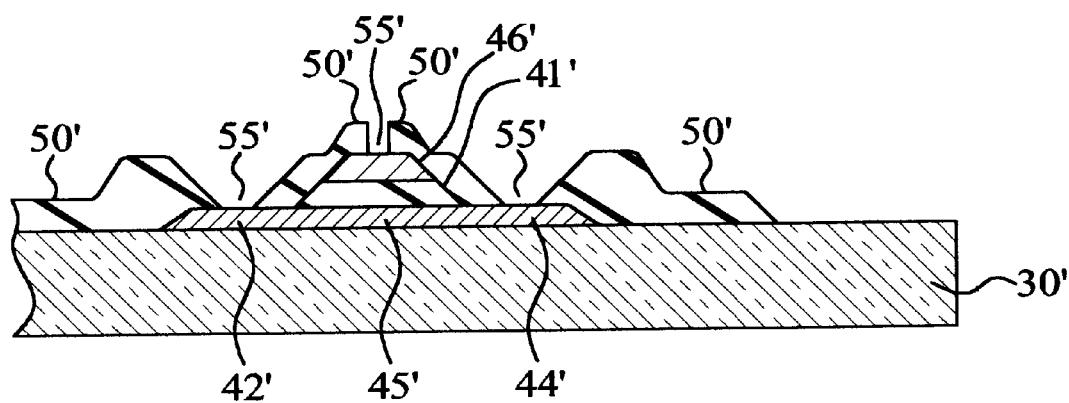
Figure 11D:
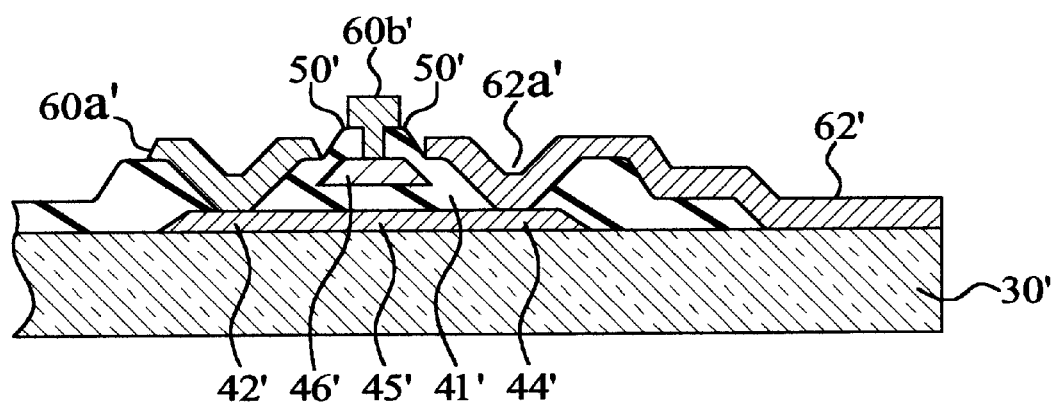
Figure 11E:
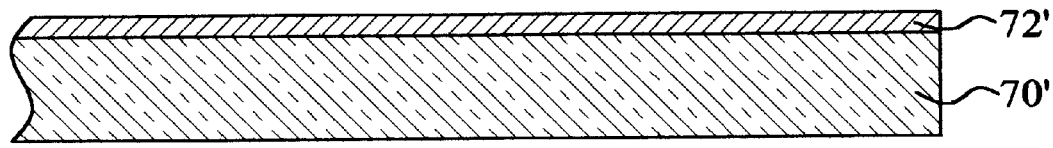
Figure 11:
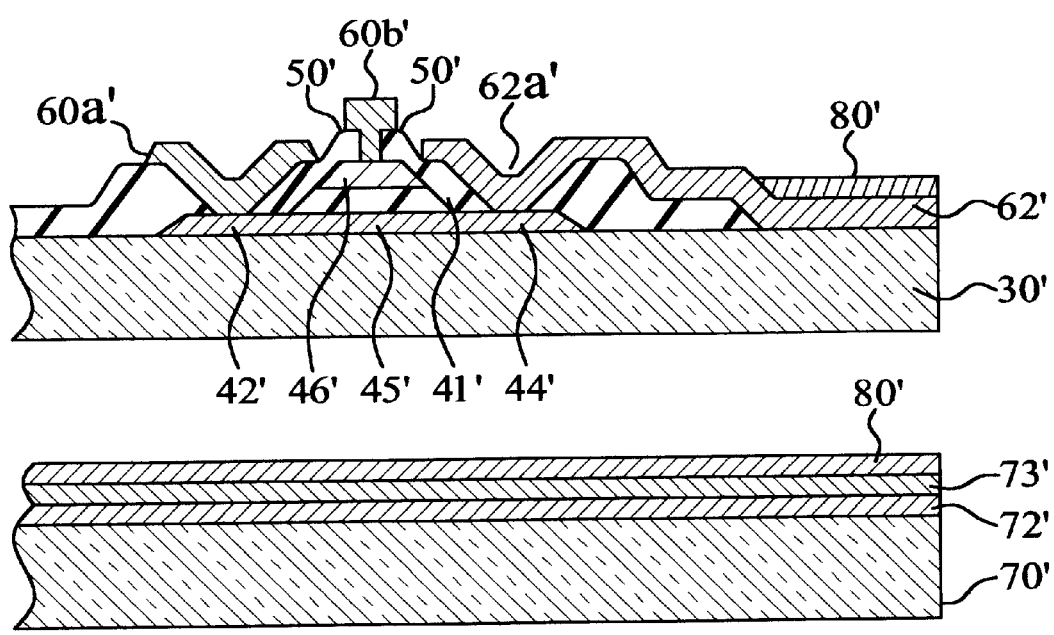
Figure 11G:
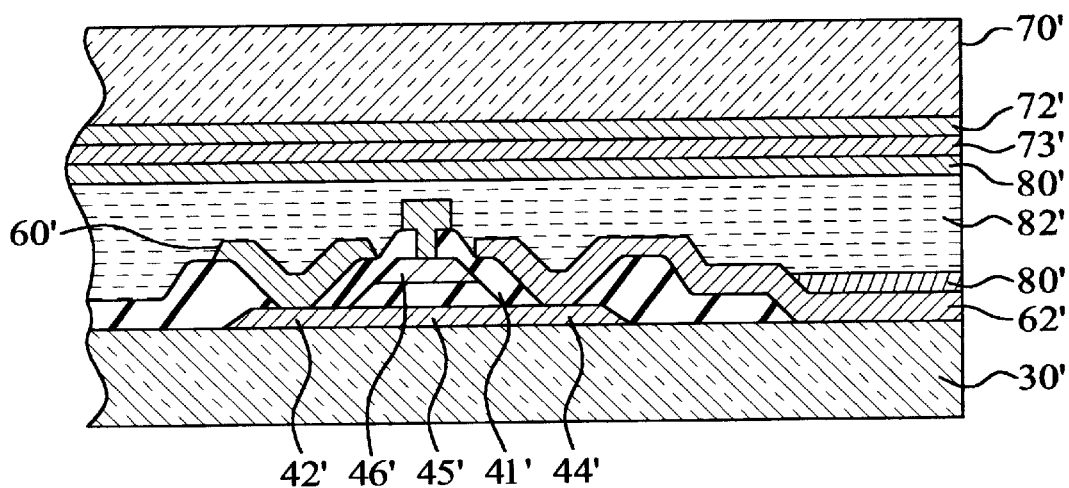

The starting material is a sapphire ($Al_2O_3$) substrate 30' in the form of a wafer that is topped with a thin layer of device quality silicon 40', see FIG. 11A. One method to achieve this is by epitaxial deposition of silicon by thermal decomposition of silane and subsequent ion implantation and solid phase regrowth techniques. This method uses an ion implantation of $^{28}Si$ atoms (doses on the order of $10^{14}$ $cm^{-2}$ at 185 keV) into the near interfacial region of the silicon-sapphire interface while the temperature of the wafer is maintained at −20 degrees C. Next, the silicon is thermally annealed at 900° C. in nitrogen for one hour after a soak for about 30 minutes at 550 degrees C and a thermal ramp over the course of an hour from 550 degrees C to 900 degrees C. The silicon is then oxidized at 1000° C. which consumes a portion of the silicon layer. The oxide is subsequently etched leaving a silicon layer of reduced thickness. The oxidation and etch process can be repeated to obtain a nominally 30 to 100 nm thick layer of silicon, i.e. a thin film device quality silicon layer, on sapphire. This starting material forms the basis for the optical, mechanical, electrical and thermal advantages over the prior art. In particular, a salient feature resulting from the fabrication of the display in 30 nm to 100 nm thick silicon films rather than thick films (>100 nm) of silicon-on-sapphire as taught in the prior art offers substantial improvement in absorption (i.e. increased brightness), resistance to heating and parasitic photoexcited carriers.

Next, the single nonlinear circuit element, a MOSFET, is fabricated in each pixel on the thin film silicon layer. Simultaneously, a plurality of MOSFETs and related circuit elements are fabricated forming the associated circuits using suitably designed photolithographic masks. A series of fabrication steps that are a modification of a conventional self-aligned thin film transistor fabrication process for a MOSFET are employed. The series includes: patterning a first portion of the thin film silicon layer (using lithographic and etching techniques), growing gate oxide by exposing wafers to an oxygen ambient at an elevated temperature, depositing polysilicon (i.e. polycrystalline silicon) by chemical vapor deposition (CVD), doping the polysilicon in-situ during deposition or by ion implanting dopant ions or defusing by temperatures dopants from a deposited glass, patterning polysilicon (by similar lithographic and etch techniques used above), selectively doping the source and drain regions of the MOSFETs by ion implanting and annealing at elevated temperatures, depositing and patterning of an oxide layer to form a sidewall oxide, which results in the self-aligned structure seen in FIG. 11B. The doped polysilicon is a conductive material which forms the gate electrode. This MOSFET structure contains the gate oxide 41', source region 42', drain region 44', channel region 45', gate electrode 46' and sidewall oxide 47'.

At this stage improved contacts may be formed, if desired, using silicidation techniques. This involves depositing a suitable metal, e.g. titanium, and rapid thermal annealing of the wafer which provides for the formation of a low resistivity metal silicide contact in the areas where the metal was in contact with polysilicon (the source and drain regions of the MOSFETs) and the gate electrode. The metal which is not in contact with polysilicon and the gate electrode is unreacted, and subsequently etched from the wafer.

The process continues with depositing passivation oxide 50' by CVD, patterning contact holes 55' in the oxide (by same methods used above) to make contact with the source region 42', drain region 44' and gate region (via gate electrode 46'), see FIG. 11C. Depositing and patterning interconnect metallization follows with the resulting structure shown in FIG. 11D. The interconnect metallization may itself be the product of a multiple step process. For example, an aluminum alloy (99%Al, 1%Si) may be deposited and patterned for all contacts including source contact 60$a$' and gate contact 60$b'$ and interconnections with the silicon MOSFETs and related devices and circuits. A transparent conductive material such as indium tin oxide (ITO) may be subsequently deposited and patterned as a transparent drain contact 62$a$' that also extends as a transparent ferroelectric liquid crystal capacitor contact or electrode 62' for a ferroelectric liquid crystal capacitor to be described, (the interconnect metallization also forms the output electrode from the MOSFET to pixel electrode 62').

At this stage of the process, the monolithically integrated circuitry and the MOSFETs at each pixel are completely fabricated and may, if desired, be covered with additional passivation, shielding or planarization layers useful in certain applications. A corresponding transparent substrate 70', e.g. sapphire, quartz, fused silica or glass, also is covered with a transparent metallized counter electrode 72', and appropriately patterned if desired, see FIG. 11E. This counter electrode is normally common for the entire pixel array. Noting FIG. 11F, if desired, a means for colored display 73' may be included, for example by attachment of a colored filter, or incorporation of a colored dye and the like on the counter electrode. However, in the preferred embodiment the color is provided off the display as described above to allow an ultra-high pixel density. Alignment layers 80' are then formed on the pixel electrodes, if desired. This can entail the deposition of a thin layer of polyimide which is subsequently mechanically rubbed to obtain a preferred orientation. The process for forming alignment layers is well known in the art of liquid crystals and variations are readily accommodated by this fabrication process.

Figure 11H:
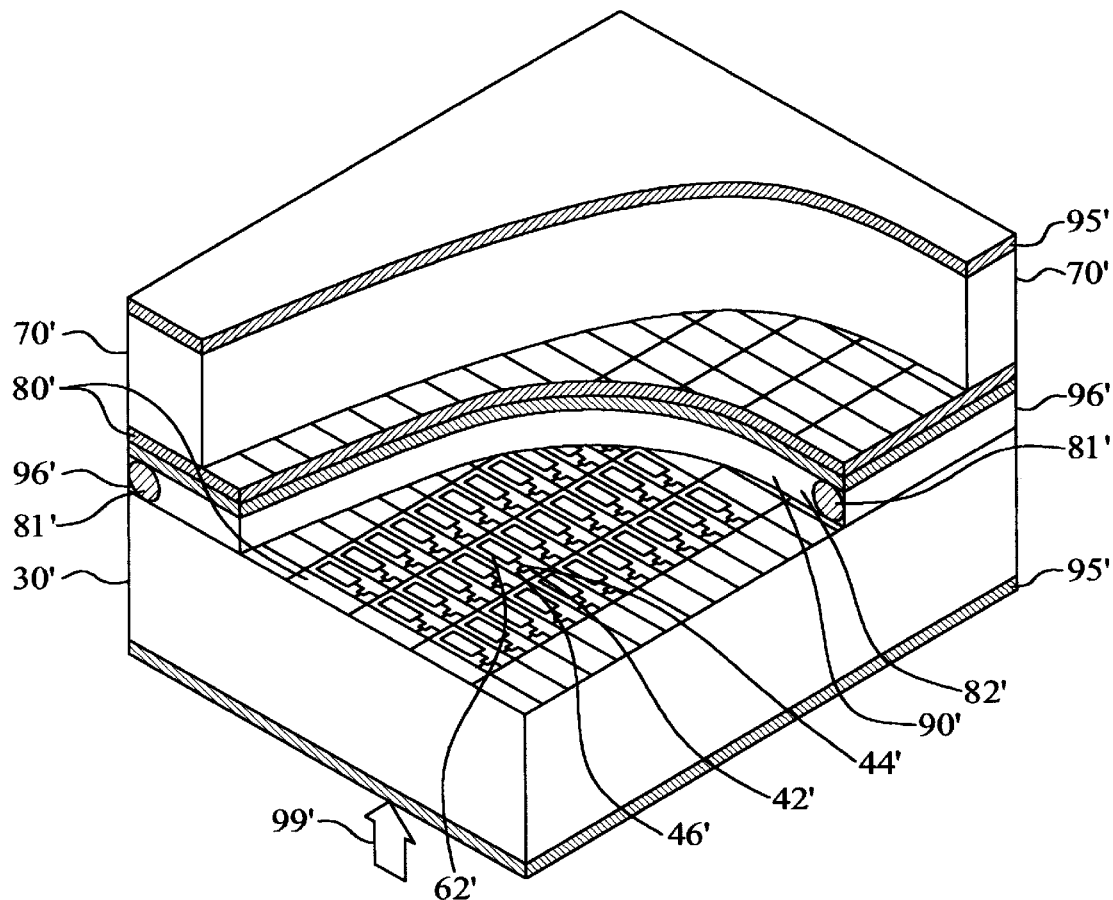

Noting FIG. 11H, means to appropriately space each pixel electrode 62' from counter electrode 72' is provided using, for example, fiber glass spacer rods or beads 81', such as practiced in the art. This spacer means normally lies at the periphery of the chip. Final assembly requires, correctly orienting the alignment layers 80', appropriately adjoining of substrate 30' at its respective appropriate predetermined portions with substrate 70' at its respective appropriate predetermined portions, forming a cavity 82', vacuum filling of the cavity with desired liquid crystal material 90', and hermetically sealing or plugging the cavity, schematically depicted by the flat closures 96'. It is understood that this configuration is for the purposes of demonstration only, see FIG. 11G. One skilled in the art to which this invention pertains would be apprised of appropriate closure configurations and techniques for accomplishing same.

Figure 12A:
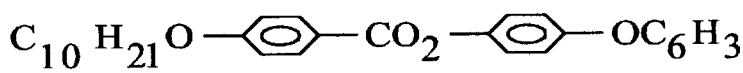
FIGS. 12A and 12B respectively show examples of achiral and chiral dopant materials used for ferroelectric liquid crystals.
Figure 12A:
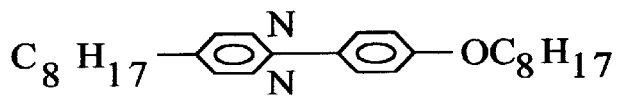
Figure 12A:
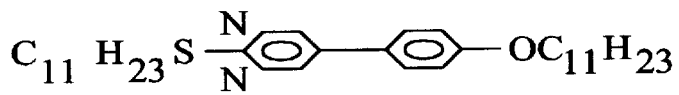
Figure 12A:
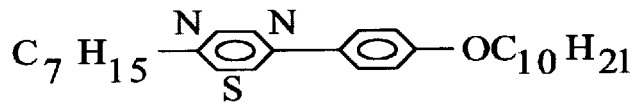
Figure 12A:
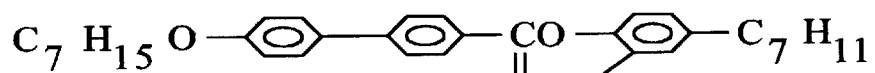
Figure 12A:
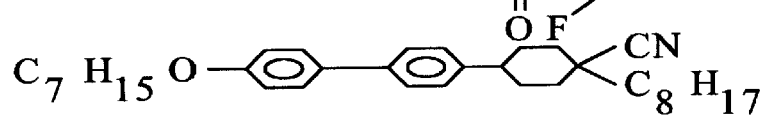
Figure 12A:
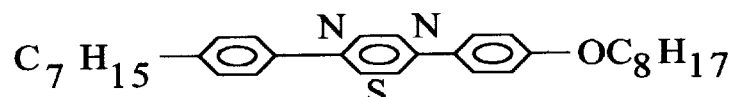
Figure 12A:
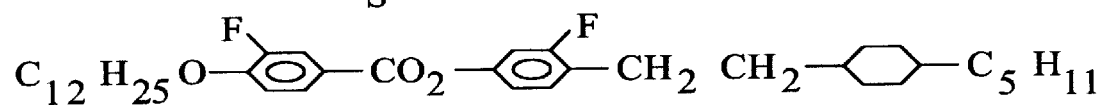
Figure 12B:
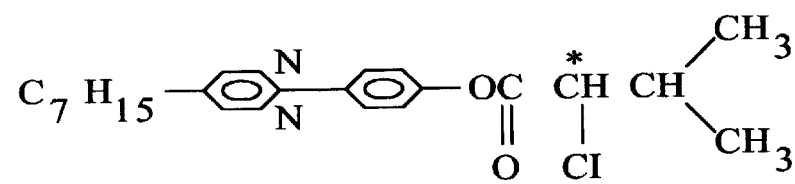
Figure 12B:
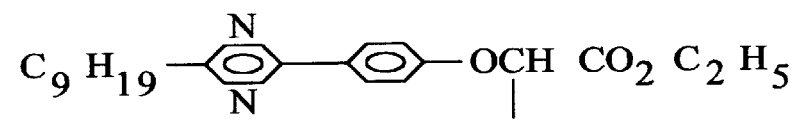
Figure 12B:
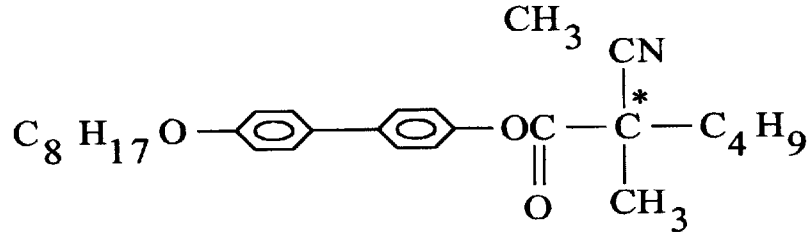

The ferroelectric liquid crystal materials used to fill the cavity are commonly mixtures using achiral (i.e. non chiral) smectic C* compounds as the basis material. Examples of achiral materials include phenyl benzoates, phenyl-pyrimidine compounds, and other two-ring compounds. Three-ring compounds such as cyclohexane carbonitrile derivatives and phenyl-thiadiazols may also be used. FIG. 12A shows some achiral compounds used in prior art for FLC mixtures that are compatible with the herein described invention. FIG. 12B shows some chiral dopant compounds used in mixtures in the prior art for FLC mixtures which also are compatible with the herein described invention.

Affixing appropriately oriented polarizers 95' to the front and back surfaces finalizes the fabrication of the monolithic display system, see cutaway plan-view in FIG. 11H which shows a plurality of the pixels arrayed in the form of a display.

Figure 13:
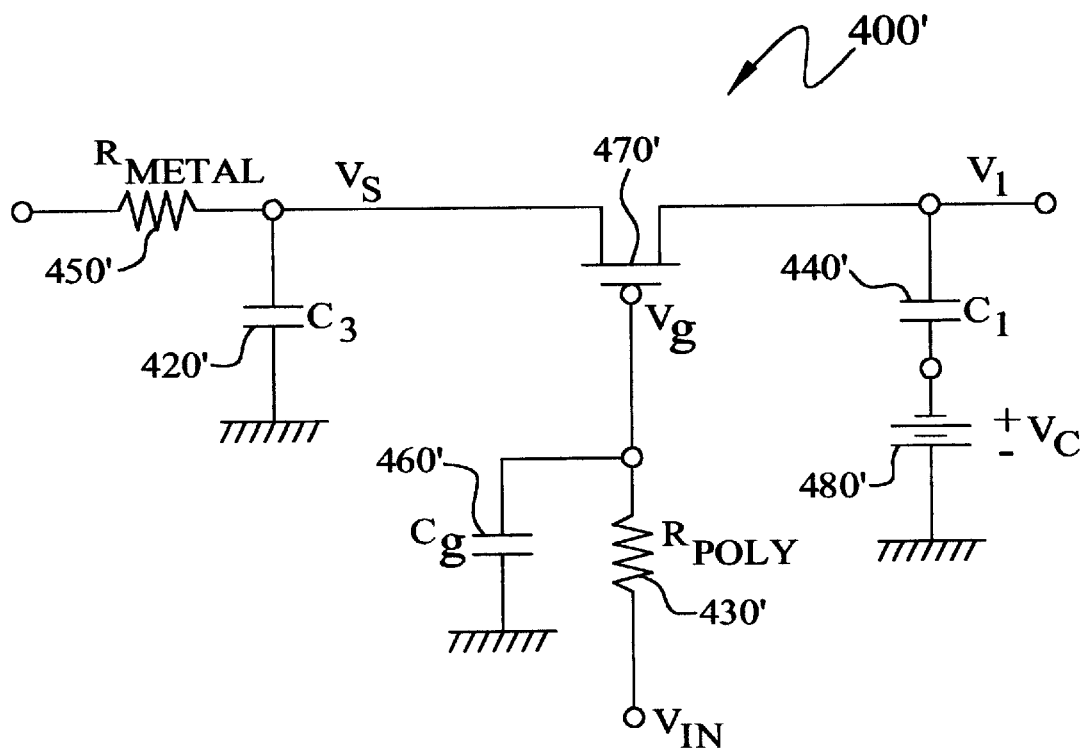
FIG. 13 shows the equivalent electrical schematic for a 1000 pixel×1000 pixel active matrix ferroelectric liquid crystal display on an improved-UTSOS wafer.

FIG. 13 shows an electrical schematic 400' for a 1000 pixel×1000 pixel active matrix ferroelectric liquid crystal display on an improved UTSOS wafer used to calculate the electrical performance advantages of the disclosed invention. Typical capacitance for a ferroelectric liquid crystal (FLC) capacitor 440' is 4.5 nF/cm². Given the geometry detailed in FIG. 9 with a 57.6 square micron electrode area, the FLC capacitor has a capacitance of 0.0026 pF. The total series capacitance 420' from the row of MOSFETs in the display is equal to the number of transistors (1000) times the gate width (3.0 $\mu$m) times the junction capacitance (250 pF/m) which yields 1.0 pF. The total gate capacitance 460' for the row of MOSFETs fabricated in UTSOS is given by the number of transistors (1000) times the gate oxide capacitance (1.4×10$^{-3}$ pF/$\mu$m²) times the gate width (3.0 $\mu$m) times the gate length (3.0 $\mu$m) which yields approximately 13 pF. The resistance of the polysilicide line and the metal line shown in FIG. 9 is calculated from the equation: R=$\rho$L/W, where $\rho$ is the resistivity, L is the line length and W is the line width. For a polysilicide line with 1.5$\Omega$/□ resistivity and L/W equal to 6.0 mm/2.0 $\mu$m, the resulting resistance 430 is 4.5 k$\Omega$. Similarly, for the metal (aluminum) line with 0.01$\Omega$/□ resistivity and L/W equal to 6.0 mm/2.0 $\mu$m, the resulting resistance 450' is 30$\Omega$. These parameters were subsequently substituted into a circuit simulation program to emulate the circuit performance of the arrangement of schematic 400' which also includes MOSFET 470' and voltage source 480' that may be said to be integrated in the wafer via suitable integrated circuitry and conductors.

Figure 14:
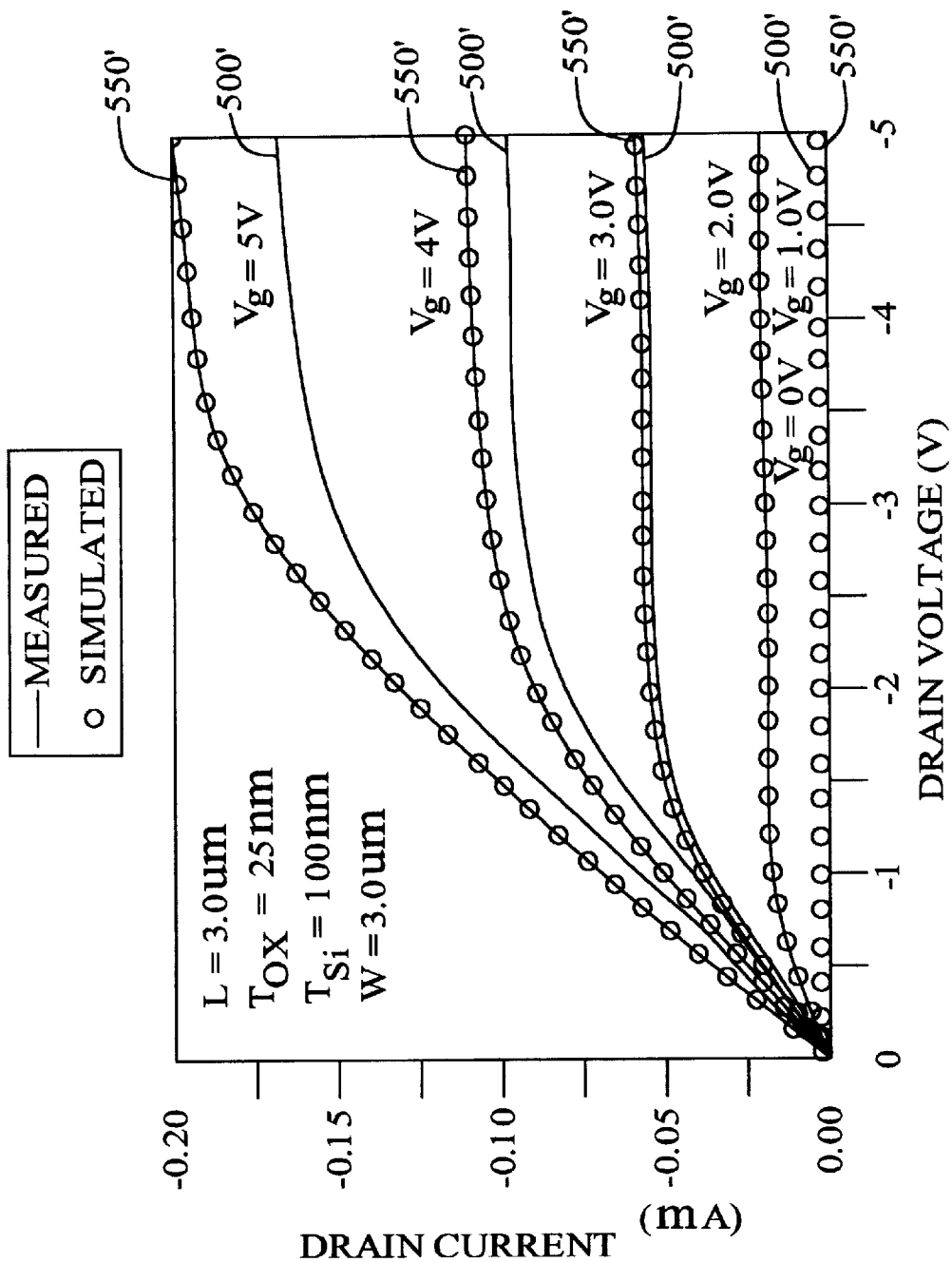
FIG. 14 shows measured and simulated data for the transistor element in each pixel of the ferroelectric liquid crystal display.
Figure 15:
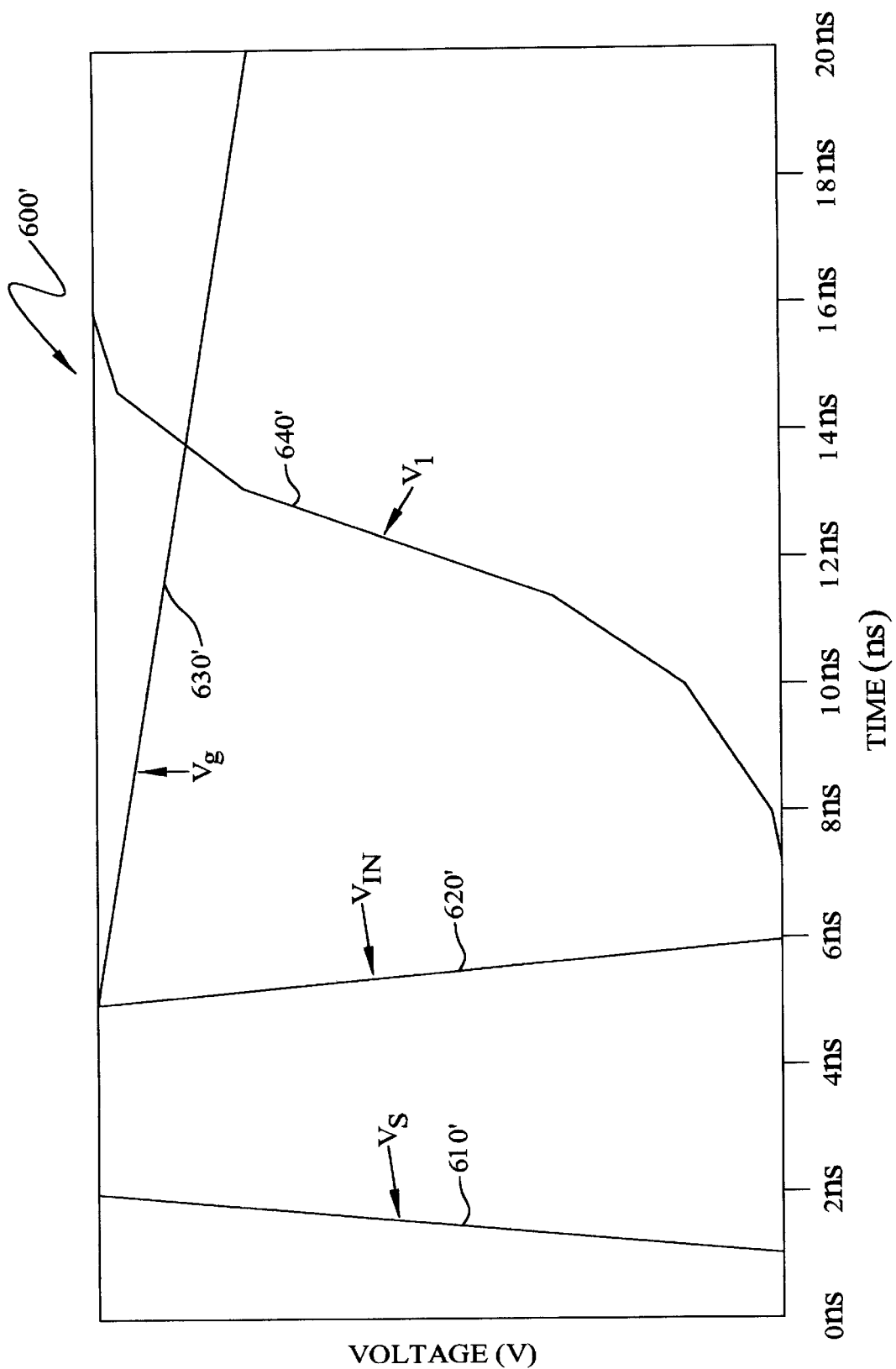
FIG. 15 depicts the voltage transients for the ferroelectric liquid crystal pixel circuitry.

FIG. 14 shows measured 500' and simulated 550' data for the transistor element in each pixel of the ferroelectric liquid crystal display using the above parameters. This figure shows the characteristic family of curves for the drain current versus drain voltage. FIG. 15 depicts the simulated voltage transients 600' for the ferroelectric liquid crystal pixel circuitry. $V_s$610' is first switched from 0 to 14 volts to simulate setting the pixel's column voltage high. $V_{in}$620' is then dropped from 14 to 0 volts to simulate accessing the pixel's row. $V_g$630' drops more slowly due to the capacitive loading of the 1000 gates which must be set in parallel and the resistive load of the 6.0 mm polysilicide line. $V_f$640' the voltage across the pixel capacitor begins switching when $V_g$630' drops below the switching transistor's threshold and is completely switched by 18 nanoseconds. This simulation shows that this design is capable of addressing the entire 1000×1000 pixel display in less than 20 nanoseconds. This illustrates the synergistic advantage of utilizing UTSOS with FLC's since the FLC's require this high rate of addressing in order to fully utilize their advantages.

The display described above is the preferred embodiment for a direct view application such as in a head-mounted system or as a viewfinder on a camcorder. For a projection system this array could be used as a light valve. In the preferred embodiment, there would be a light blocking element fabricated above the switching transistor to shield the transistor from most of the light and thereby lower the photo-induced leakage current.

The above teachings detail the invention as a backlit or projection display with light 99' coming from one side of the display; see FIG. 11H. The display area is an active-matrix display using a plurality of pixels in an array compatible with HDTV and other ultra-high resolution displays (1000× 1000 pixels or more). Each pixel uses a single MOSFET fabricated in UTSOS as the nonlinear element and an adjacent ferroelectric liquid crystal capacitor which is switched by the MOSFET. The use of the high switching speed of the ferroelectric liquid crystal (as opposed to twisted nematics) provides for rapid driving of the display utilizes the high speed performance of UTSOS devices to drive very large displays. The small size and reliability of the MOSFET which can be fabricated in ultra-thin single crystal SOS eliminates the need for redundant nonlinear elements thereby reducing the pixel size yet increasing the display brightness. Noting FIG. 7, row and column drivers 14' are integrated in the UTSOS wafer 11' adjacent to display area 12' to address the source and gate portions in the display area. These drivers may consist of shift registers which sequentially clock on the signal voltage to the appropriately selected pixels. The design and architecture of shift registers are well known to those skilled in the art of electrical design, however the advantages of UTSOS provides for very high speed performance due to the elimination of parasitic capacitances from the devices to the substrate. Additional VLSI circuitry can be included monolithically on-chip, (on the wafer) to control external component driving and synchronization/timing for example when using a color scheme with external time multiplexing. This is only possible due to the high quality material and high speed devices available with UTSOS.

This invention provides both a transparent substrate and bulk-silicon-like, single crystal, device quality semiconductor material for fabrication of high density circuitry. In addition to increased functionality of the display system by monolithically integrating VLSI circuitry including video drivers, analog-to-digital converters, digital logic and the like, there is a concomitant improvement in reliability because of fewer connections and wire bonds. This results in higher fabrication yields and lower system costs. The use of CMOS technology detailed herein also offers low power consumption important for battery operated display systems. Moreover, the high speed electronics of UTSOS is amenable with future advances in liquid crystal chemistry which continue to seek even faster switching FLCs and may be readily utilized.

In the preferred embodiment, the electrical signal voltage received on-chip undergoes data decompression and related image processing in monolithically adjacent VLSI circuitry fabricated in UTSOS that is matched with ferroelectric liquid crystal materials for optimal performance. The synergism of the combined technologies and produces salient advantages that can not be achieved by the prior art of display technology.

Obviously, numerous modifications and variations of the present invention are possible in light of the above teachings. It is therefore understood that within the scope of the appended claims the invention may be practiced otherwise than as specifically described herein.

We claim:

1. A method for fabricating a monolithically integrated ferroelectric liquid crystal array display and control circuitry on a silicon-on-sapphire structure, comprising the steps of:
   a) forming an epitaxial silicon layer on a sapphire substrate to create a silicon-on-sapphire structure;
   b) ion implanting said epitaxial silicon layer;
   c) annealing said silicon-on sapphire structure;
   d) oxidizing said epitaxial silicon layer to form a silicon dioxide layer from a portion of said epitaxial silicon layer so that a thinned epitaxial silicon layer remains;
   e) removing said silicon dioxide layer to expose said thinned epitaxial silicon layer;
   f) fabricating an array of pixels from said thinned epitaxial silicon layer wherein each of said pixels includes a ferroelectric liquid crystal capacitor; and
   g) fabricating integrated circuitry from said thinned epitaxial silicon layer which is operably coupled to modulate said pixels.

2. The method of claim 1 wherein step (b) includes implanting silicon ions into said epitaxial silicon layer.

3. The method of claim 1 wherein said thinned epitaxial silicon layer has a generally uniform thickness no greater than about 100 nanometers.

4. The method of claim 1 wherein said pixels each include nonlinear circuit elements.

5. The method of claim 1 wherein each pixel includes a transistor coupled to said ferroelectric liquid crystal capacitor.

6. The method of claim 5 wherein said transistor has a leakage current, $I_L$, where $I_L \leq 1$ pA/w, and w represents a micron of width of said transistor.

7. The method of claim 1 wherein said integrated circuity modulates each pixel individually.

8. The method of claim 1 further includes fabricating polarizers on said silicon-on-sapphire structure.

9. The method of claim 8 further includes forming a layer of optical filters on said silicon-on sapphire structure.

10. The method of claim 1 further includes transmitting light through said array of pixels.

11. The method of claim 2 includes the steps of:
   implanting said silicon ions at a dosage of about $10^{14}$ cm$^{-2}$, at an energy level of about 185 keV and, at a temperature of about −20° C.;
   immersing said silicon-on-sapphire structure in a nitrogen atmosphere having a temperature of about 550° C. for approximately 30 minutes;
   increasing the temperature of said nitrogen atmosphere in which said silicon-on-sapphire structure is immersed from about 550° C. to about 900° C. in about one hour;
   annealing said silicon-on sapphire structure in said nitrogen atmosphere for about one hour at 900° C.; and
   oxidizing said epitaxial silicon layer in an oxygen atmosphere having a temperature of about 1000° C.

12. A method for fabricating a monolithically integrated liquid crystal array display and control circuitry on a silicon-on-sapphire structure, comprising the steps of:
   a) forming an epitaxial silicon layer on a sapphire substrate to create a silicon-on-sapphire structure;
   b) ion implanting silicon ions into said epitaxial silicon layer at a dosage of about $10^{14}$ cm$^{-2}$, at an energy level of about 185 keV, and at a temperature of about −20° C.;
   c) immersing said silicon-on-sapphire structure in a nitrogen atmosphere having a temperature of about 550° C. for approximately 30 minutes;
   d) increasing the temperature of said nitrogen atmosphere in which said silicon-on-sapphire structure is immersed from about 550° C. to about 900° C. in about one hour;
   e) annealing said silicon-on sapphire structure in said nitrogen atmosphere for about one hour at 900° C.; and
   f) oxidizing said epitaxial silicon layer in an oxygen atmosphere having a temperature of about 1000° C. to form a silicon dioxide layer from portion of said epitaxial silicon layer so that a thinned epitaxial silicon layer remains;
   g) removing said silicon dioxide layer to expose said thinned epitaxial silicon layer;
   h) fabricating an array of pixels from said thinned epitaxial silicon layer wherein each of said pixels includes a liquid crystal capacitor; and
   i) fabricating integrated circuitry from said thinned epitaxial silicon layer which is operably coupled to modulate said pixels.

13. The method of claim 12 wherein said thinned epitaxial silicon layer has a generally uniform thickness no greater than about 100 nanometers.

14. The method of claim 12 wherein said pixels each include nonlinear circuit elements.

15. The method of claim 12 wherein each pixel includes a transistor and said liquid crystal capacitor is a ferroelectric liquid crystal capacitor coupled to said transistor.

16. The method of claim 12 wherein each pixel includes a transistor and said liquid crystal capacitor is a nematic liquid crystal capacitor.

17. The method of claim 16 wherein the transistor has a leakage current, $I_L$, where $I_L \leq 1$ pA/w, and w represents a micron of width of said transistor.

18. The method of claim 12 wherein said integrated circuity modulates each pixel individually.

19. The method of claim 12 further includes fabricating polarizers on said silicon-on-sapphire structure.

20. The method of claim 19 further includes forming a layer of optical filters on said silicon-on sapphire structure.

21. The method of claim 12 further includes transmitting light through said array of pixels.

* * * * *